United States Patent
Taylor et al.

(10) Patent No.: US 10,147,466 B1
(45) Date of Patent: Dec. 4, 2018

(54) VOLTAGE REFERENCE COMPUTATIONS FOR MEMORY DECISION FEEDBACK EQUALIZERS

(71) Applicant: Micron Technology, Inc., Boise, ID (US)

(72) Inventors: Jennifer E. Taylor, Boise, ID (US); Raghukiran Sreeramaneni, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/716,132

(22) Filed: Sep. 26, 2017

(51) Int. Cl.
*G11C 7/10* (2006.01)
*G11C 7/02* (2006.01)
*G11C 7/20* (2006.01)

(52) U.S. Cl.
CPC .............. *G11C 7/02* (2013.01); *G11C 7/1006* (2013.01); *G11C 7/1078* (2013.01); *G11C 7/20* (2013.01)

(58) Field of Classification Search
CPC ........................................................ G11C 7/02
USPC ........................................................ 365/206
See application file for complete search history.

(56) References Cited

U.S. PATENT DOCUMENTS

| | | | |
|---|---|---|---|
| 7,224,746 B2 * | 5/2007 | Dryden | H04L 25/03343 375/285 |
| 9,461,631 B1 * | 10/2016 | Oh | H03K 5/1565 |
| 9,542,991 B1 | 1/2017 | Xie et al. | |
| 2006/0133166 A1 | 6/2006 | Kikutake et al. | |
| 2013/0145212 A1 | 6/2013 | Hsu et al. | |
| 2014/0380123 A1 | 12/2014 | Liikanen et al. | |
| 2015/0067292 A1 | 3/2015 | Grunzke | |

OTHER PUBLICATIONS

PCT International Search Report & Written Opinion for PCT Application No. PCT/US2018/039816 dated Oct. 12, 2018; 10 Pages.

* cited by examiner

*Primary Examiner* — Son Mai
(74) *Attorney, Agent, or Firm* — Fletcher Yoder, P.C.

(57) ABSTRACT

A device includes a combinational circuit configured to create a one or more distortion correction factors used offset inter-symbol interference from a data stream on a distorted bit. The device also includes a selection circuit coupled o the combinational circuit. The selection circuit includes a feedback pin configured to receive a control signal and an output, wherein the selection circuit is configured to select a first distortion correction factor of the one or more distortion correction factors based upon the control signal and transmit the first distortion correction factor from the output.

20 Claims, 14 Drawing Sheets

US 10,147,466 B1

VOLTAGE REFERENCE COMPUTATIONS FOR MEMORY DECISION FEEDBACK EQUALIZERS

BACKGROUND

Field of the Invention

Embodiments of the present disclosure relate generally to the field of semiconductor memory devices. More specifically, embodiments of the present disclosure relate to using a decision feedback equalizer (DFE) circuit of a semiconductor memory device to correct distortions in transmitted signals.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Additionally, correcting distortions in the transmitted signals continues to be important. However, conventional distortion correction techniques may not adequately correct the distortions of the signal. Errors that result from slow processes of conventional distortion correction techniques cause additional distortions to the final data, thus reducing the reliability of data transmitted within the memory devices.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Using a feedback equalizer (DFE) of a memory device to perform distortion correction techniques may be valuable, for example, to correctly compensate for distortions in the received data of the memory device. This insures that accurate values are being stored in the memory of the memory device. The DFE may use previous bit data to create corrective values to compensate for distortion resulted from the previous bit data. For example, the most recent previous bit may have more of a distortion effect on the current bit than a bit transmitted several data points before, causing the corrective values to be different between the two bits. With these levels to correct for, the DFE may operate to correct the distortion of the transmitted bit.

In some embodiments, the DFE may require the use of multiple bits of previous data in order to precisely calculate the distortion correction factor. In those embodiments, a system may be used that has all of the corrective voltages calculated prior to receiving the distorted bit and may save time during the process of correction. This technique and associated hardware may allow for multiple bits to be received and processed nearly simultaneously, leading to a very efficient system that may process distortions of received bits more quickly than may be accomplished via traditional DFE solutions.

Figure 1:
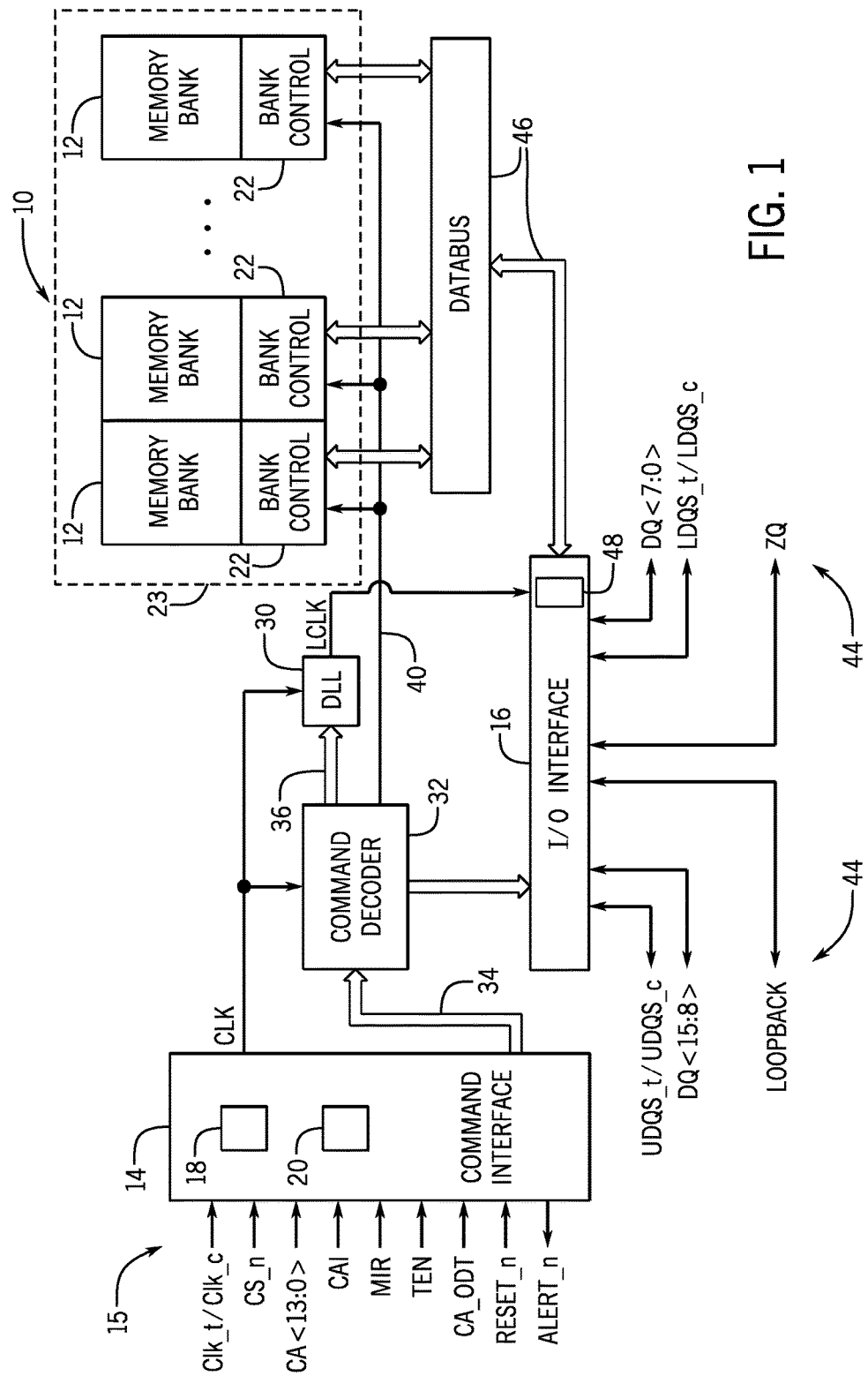
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS)

memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
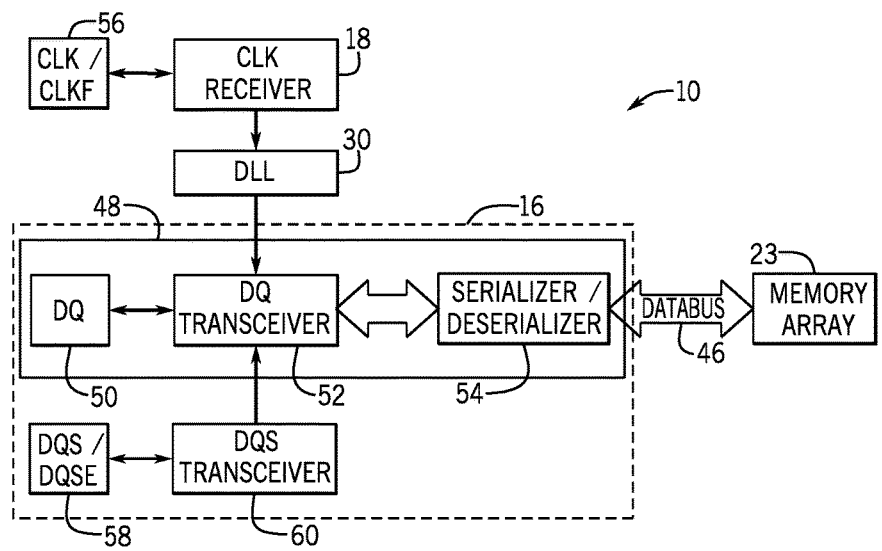
FIG. 2 illustrates a block diagram illustrating a data transceiver of the I/O interface of FIG. 1, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ connector 50, a DQ transceiver 52, and a serializer/deserializer 54. It should be noted that in some embodiments, multiple data transceivers 48 may be utilized that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ connector 50, DQ transceiver 52, and serializer/deserializer 54).

The DQ connector 50 may be, for example a pin, pad, combination thereof, or another type of interface that operates to receive DQ signals, for example, for transmission of data to the memory array 23 as part of a data write operation. Additionally, the DQ connector 50 may operate to transmit DQ signals from the memory device 10, for example, to transmit data from the memory array 23 as part of a data read operation. To facilitate these data reads/writes, a DQ transceiver 52 is present in data transceiver 48. In some embodiments, for example, the DQ transceiver 52 may receive a clock signal generated by the internal clock generator 30 as a timing signal for determining an output timing of a data read operation from the memory array 23. The clock signal transmitted by the internal clock generator 30 may be based upon one or more clocking signals received by the memory device 10 at clock connector 56 (e.g., a pin, pad, the combination thereof, etc.) and routed to the internal clock generator 30 via the clock input circuit 18. Thus, the DQ transceiver 52 may receive a clock signal generated by the internal clock generator 30 as a timing signal for determining an output timing of a data read operation from the memory array 23.

The DQ transceiver 52 of FIG. 2 may also, for example, receive one or more DQS signals to operate in strobe data mode as part of a data write operation. The DQS signals may be received at a DQS connector 60 (e.g., a pin, pad, the combination thereof, etc.) and routed to the DQ transceiver 52 via a DQS transceiver 60 that operates to control a data strobe mode via selective transmission of the DQS signals to the DQ transceiver 52. Thus, the DQ transceiver 52 may receive DQS signals to control a data write operation from the memory array 23.

As noted above, the data transceiver 48 may operate in modes to facilitate the transfers of the data to and from the memory device 10 (e.g., to and from the memory array 23). For example, to allow for higher data rates within the memory device 10, a data strobe mode in which DQS signals are utilized, may occur. The DQS signals may be driven by an external processor or controller sending the data (e.g., for a write command) as received by the DQS connector 58 (e.g., a pin, pad, the combination thereof, etc.). In some embodiments, the DQS signals are used as clock signals to capture the corresponding input data.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from, for example, a host device having a serial format into a parallel format suitable for storage in the memory array 23. Likewise, the serializer/deserializer 54 operates to translate data received from, for example, the memory array 23 having a parallel format into a serial format suitable for transmission to a host device.

Figure 3:
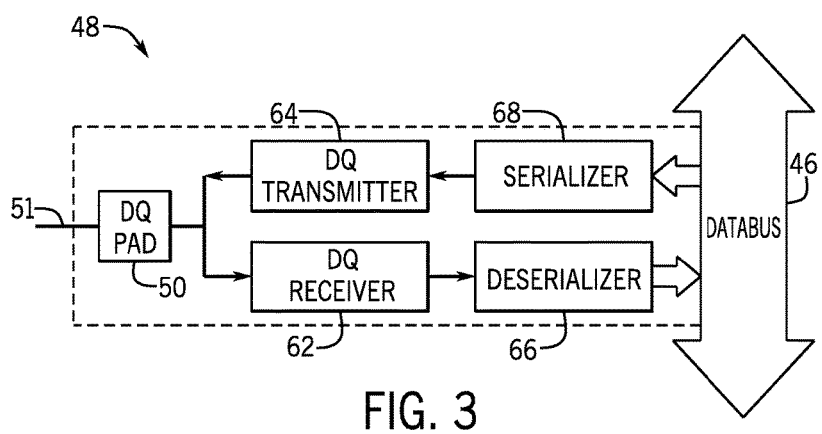
FIG. 3 illustrates a block diagram of an embodiment of the data transceiver of FIG. 2, according to an embodiment of the present disclosure.

FIG. 3 illustrates the data transceiver 48 as including the DQ connector 50 coupled to data transfer bus 51, a DQ receiver 62, a DQ transmitter 64 (which in combination with the DQ receiver 62 forms the DQ transceiver 52), a deserializer 66, and a serializer 68 (which in combination with the deserializer 66 forms the serializer/deserializer 54). In operation, the host (e.g., a host processor or other memory device described above) may operate to transmit data in a serial form across data transfer bus 51 to the data transceiver 48 as part of a data write operation to the memory device 10. This data is received at the DQ connector 50 and transmitted to the DQ receiver 62. The DQ receiver 62, for example, may perform one or more operations on the data (e.g., amplification, driving of the data signals, etc.) and/or may operate as a latch for the data until reception of a respective DQS signal that operates to coordinate (e.g., control) the transmission of the data to the deserializer 66. As part of a data write operation, the deserializer 66 may operate to convert (e.g., translate) data from a format (e.g., a serial form) in which it is transmitted along data transfer bus 51 into a format (e.g., a parallel form) used for transmission of the data to the memory array 23 for storage therein.

Likewise, during a read operation (e.g., reading data from the memory array 23 and transmitting the read data to the host via the data transfer bus 51), the serializer 68 may receive data read from the memory array in one format (e.g., a parallel form) used by the memory array and may convert (e.g., translate) the received data into a second format (e.g., a serial form) so that the data may be compatible with one or more of the data transfer bus 51 and/or the host. The converted data may be transmitted from the serializer 68 to the DQ transmitter 64, whereby one or more operations on the data (e.g., de-amplification, driving of the data signals, etc.) may occur. Additionally, the DQ transmitter 64 may operate as a latch for the received data until reception of a respective clock signal, for example, from the internal clock generator 30, that operates to coordinate (e.g., control) the transmission of the data to the DQ connector 50 for transmission along the data transfer bus 51 to one or more components of the host.

Figure 4:
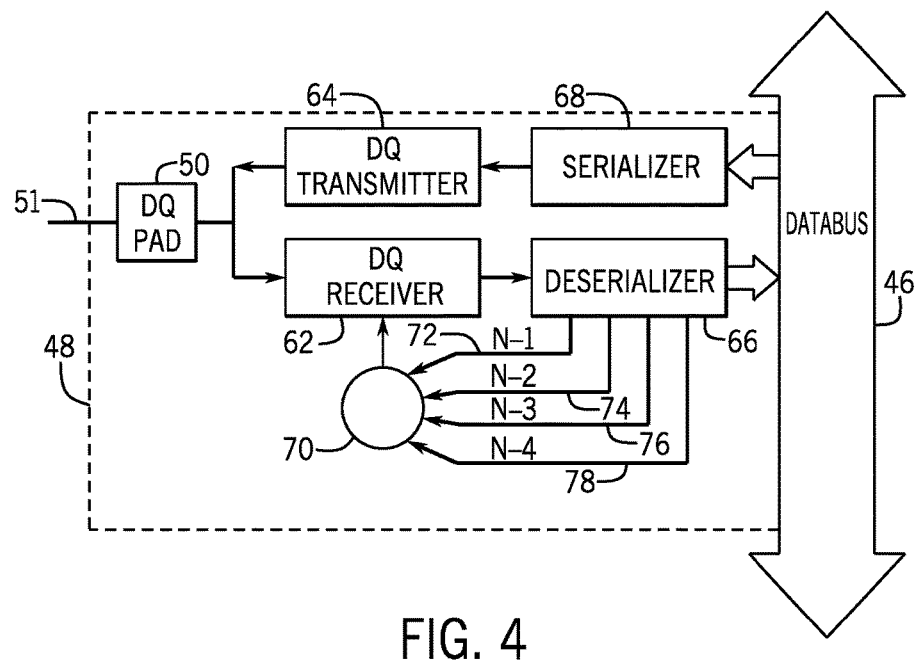
FIG. 4 illustrates a block diagram of a second embodiment of the data transceiver of FIG. 2, according to an embodiment of the present disclosure.

In some embodiments, the data received at the DQ connector 50 may be distorted. For example, data received at the DQ connector 50 may be affected by inter-symbol interference (ISI) in which previously received data interferes with subsequently received data. For example, due to increased data volume being transmitted across the data transfer bus 51 to the DQ connector 50, the data received at the DQ connector 50 may be distorted relative to the data transmitted by the host. One technique to mitigate (e.g., offset or cancel) this distortion and to effectively reverse the effects of ISI is to apply an equalization operation to the data. FIG. 4 illustrates an embodiment of the data transceiver 48 inclusive of an equalizer that may be used in this equalization operation.

FIG. 4 illustrates one embodiment of the data transceiver 48 inclusive of an equalizer, in particular, a decision feedback equalizer (DFE) 70. As illustrated, the DFE 70 is a multi-tap (e.g., four-tap) DFE 70. However, less or more than four taps may be utilized in conjunction with the DFE 70. Likewise, the DFE 70 may be disposed separate from or internal to the deserializer 66 or the DQ receiver 62. In operation, a binary output (e.g., from a latch or decision-making slicer) or an indication of a binary output is captured in one or more data latches or data registers. In the present embodiment, these data latches or data registers may be disposed in the deserializer 66 and the values stored therein may be latched or transmitted along paths 72, 74, 76, and 78.

When a data bit is received at the DQ receiver 62, it may be identified as being transmitted from the host as bit "n" and may be received at a time to as distorted bit n (e.g., bit n having been distorted by ISI). The most recent bit received prior to distorted bit n being received at the DQ receiver 62, e.g., received at time of $t_{-1}$ that immediately precedes time of to, may be identified as n-1 and is illustrated as being transmitted from a data latch or data register along path 72. The second most recent bit received prior to distorted bit n being received at the DQ receiver 62, e.g., received at time of $t_{-2}$ that immediately precedes time of $t_{-1}$, may be identified as n-2 and is illustrated as being transmitted from a data latch or data register along path 74. The third most recent bit received prior to distorted bit n being received at the DQ receiver 62, e.g., received at time of $t_{-3}$ that immediately precedes time of $t_{-2}$, may be identified as n-3 and is illustrated as being transmitted from a data latch or data register along path 76. The fourth most recent bit received prior to distorted bit n being received at the DQ receiver 62, e.g., received at time of $t_{-3}$ that immediately precedes time of $t_{-2}$, may be identified as n-4 and is illustrated as being transmitted from a data latch or data register along path 78. Bits n-1, n-2, n-3, and n-4 may be considered the group of bits that interfere with received distorted bit n (e.g., bits n-1, n-2, n-3, and n-4 cause ISI to host transmitted bit n) and the DFE 70 may operate to offset the distortion caused by the group of bits n-1, n-2, n-3, and n-4 on host transmitted bit n.

Thus, the values latched or transmitted along paths 72, 74, 76, and 78 may correspond, respectively, to the most recent previous data values (e.g., preceding bits n-1, n-2, n-3, and n-4) transmitted from the DQ receiver 62 to be stored in memory array 23. These previously transmitted bits are fed back along paths 72, 74, 76, and 78 to the DFE 70, which operates to generate weighted taps (e.g., voltages) that may be and added to the received input signal (e.g., data received from the DQ connector 50, such as distorted bit n) by means of a summer (e.g., a summing amplifier). In other embodiments, the weighted taps (e.g., voltages) may be combined with an initial reference value to generate an offset that corresponds to or mitigates the distortion of the received data (e.g., mitigates the distortion of distorted bit n). In some embodiments, taps are weighted to reflect that the most recent previously received data (e.g., bit n-1) may have a stronger influence on the distortion of the received data (e.g., distorted bit n) than bits received at earlier times (e.g., bits n-1. n-2, and n-3). The DFE 70 may operate to generate magnitudes and polarities for taps (e.g., voltages) due to each previous bit to collectively offset the distortion caused by those previously received bits.

For example, for the present embodiment, each of previously received bits n-1, n-2, n-3, and n-4 could have had one of two values (e.g., a binary 0 or 1), which was transmitted to the deserializer 66 for transmission to the memory array 23 and, additionally, latched or saved in a register for subsequent transmission along respective paths 72, 74, 76, and 78. In the illustrated embodiment, this leads to sixteen (e.g., $2^4$) possible binary combinations (e.g., 0000, 0001, 0010, . . . , 1110, or 1111) for the group of bits n-1, n-2, n-3, and n-4. The DFE 70 operates to select and/or generate corresponding tap values for whichever of the aforementioned sixteen combinations are determined to be present (e.g., based on the received values along paths 72, 74, 76, and 78) to be used to adjust either the input value received from the DQ connector 50 (e.g., distorted bit n) or to modify a reference value that is subsequently applied to the input value received from the DQ connector 50 (e.g., distorted bit n) so as to cancel the ISI distortion from the previous bits in the data stream (e.g., the group of bits n-1, n-2, n-3, and n-4).

Use of distortion correction (e.g., a DFE 70) may be beneficial such that data transmitted from the DQ connector 50 is correctly represented in the memory array 23 without distortion. Accordingly, it may be useful to store the previous bit data to use in the distortion correction. As illustrated in the block diagram of FIG. 5, a distortion correction circuit 80 may be included as part of the DQ receiver 62 but may not be required to be physically located there (e.g., the distortion correction circuit 80 may instead be coupled to the DQ receiver 62). In some embodiments, the distortion correction circuit 80 may be operated to provide previously transmitted bit data to correct a distorted bit 81 (e.g., bit having been distorted by ISI and/or system distortions) transmitted via a channel 84 (e.g., connection, transmission line, and/or conductive material).

The distorted bit 81 may be transmitted to an amplifying device 82 (e.g., variable gain amplifier) from a channel 84. The distorted bit 81 may be transmitted from the amplifying device 82 to the DFE 70, illustrated as having a single weighted tap 86. The distorted bit 81 may be transmitted simultaneously with a DQ reference signal 83 to the DFE 70. The DQ reference signal 83 may represent a threshold value (e.g., a voltage level) for determination if the transmitted bit received by the DQ connection 50 was a logical low (e.g., 0) or a logical high (e.g., 1).

The DFE 70 may be operated to correct the distortion from the distorted bit 81 using the tap weighted with previous bit data (e.g., n-1 bit data). Data (e.g., logical 1 or logical 0) for an n-1 bit may be transmitted through the path 72. The magnitudes and polarities of the single weighted tap 86 may offset the total distortion caused by the n-1 bit via summer circuit 85, which operates as a current summer that applies current to the distorted bit 81 to offset for distortion caused by the n-1 bit. For example, if the received bit at the DQ connection 50 is determined to be below the DQ reference signal 83, the received bit 81 is transmitted to the memory array 23 as a logical low. The magnitude and polarity of the weighted tap 86 may be able to correct the distorted bit 81 and the DQ reference signal 83.

A modified version of the distorted bit 81 and a modified version of the DQ reference signal 83 may be transmitted to a latching element (e.g., a regenerative latch, a slicer, etc.) illustrated as data latch 94. A corrected bit 88 may be generated via the data latch 94 and transmitted from the data latch 94 to the deserializer 66, which may occur on the rising edge of the DQS signal 96. In other embodiments, variations of the clocking scheme may be followed to be inclusive of additional or alternative methods of data transmission. The value for the new n-1 bit may be stored, for example, in the deserializer 66 for transmission along the path 72 when the corrected bit 88 is received in the deserializer 66. The distortion correction circuitry associated with the DFE 70 and the amplifying device 82 may be described in greater detail below.

Figure 5:
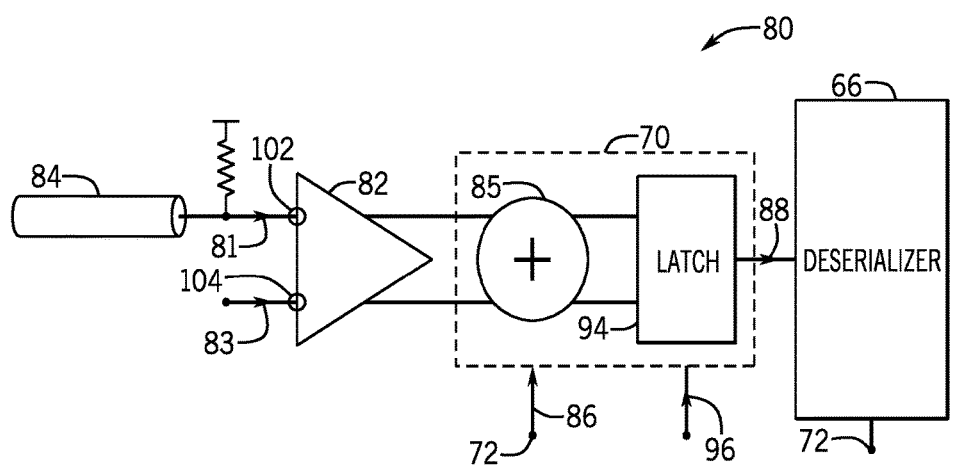
FIG. 5 illustrates a block diagram of a distortion correction circuit, according to an embodiment of the present disclosure.
Figure 6:
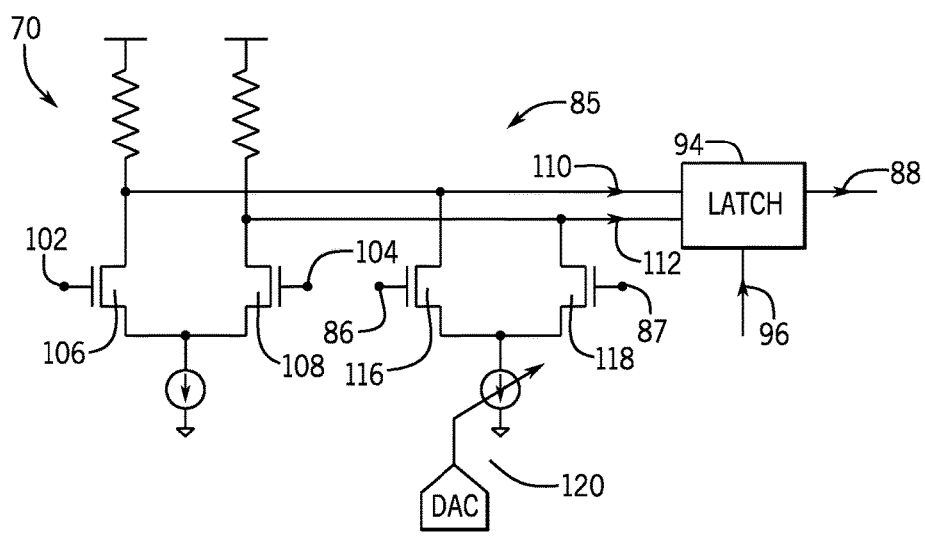
FIG. 6 illustrates a circuit diagram of a portion of the decision feedback equalizer (DFE), according to an embodiment of the present disclosure.

FIG. 6 illustrates a circuit diagram of a portion of the DFE 70 of FIG. 5 that may negate distortions associated with the distorted bit 81. Data bits may be received at a first input 102 and a second input 104 to the summer circuit 85. The first input 102 and the second input 104 may be communicatively coupled to a device that may be enabled or disabled (e.g., coupled to supply a gate signal to the field effect transistors 106 and 108). The distorted bit 81 may be received by the first input 102 and the DQ reference signal 83 may be received by the second input 104. In this manner, two of the field effect transistors 106 and 108 may be controlled by the distorted bit 81 and the DQ reference signal 83.

The weighted tap 86 and its inverse value (e.g., inverse weighted tap 87) may be transmitted to the outputs 110 and 112 to correct the distortion in the distorted bit 81. A logical high for the n-1 bit is transmitted through the path 72. In this case, the n-1 bit may be implemented to generate the weighted tap 86 and the inverse weighted tap 87 as a control signal for two field effect transistors 116 and 118 enabling the contribution of the weighted tap values 86 and 87 to the outputs 110 and 112.

The weighted tap values 86 and 87 may allow for current to be applied to outputs 110 and 112, whereby the current supplied is controlled through a controllable source 120 (e.g., a current source controlled by a digital to analog converter). The outputs 110 and 112 may be modified values of one or more of the DQ reference signal 83 and the distorted bit 81 and may be transmitted to the data latch 94 (e.g., a regenerative latch or slicer that generates a binary output). The corrected bit 88 may be generated via the data latch 94 based on the outputs 110 and 112 and may be transmitted to the deserializer 66 on the rising edge of the DQS signal 96. The n-1 bit information stored for transmission along the path 72 in the deserializer 66 may be updated with the corrected bit 88 for future distortion corrections.

Figure 7:
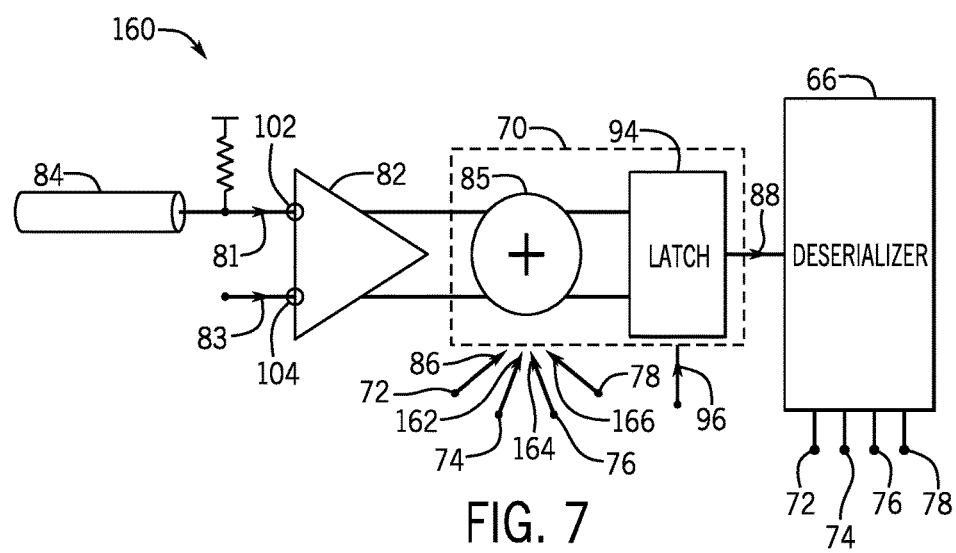
FIG. 7 illustrates a second embodiment of a distortion correction circuit, according to an embodiment of the present disclosure.

In some applications, the corrected bit 88 may need to have a greater level of precision of adjustment than the weighted taps 86 and 87 may otherwise provide. FIG. 7 illustrates a block diagram of a distortion correction circuit 160 that may receive four bits of previous data (e.g., n-1 bit data, n-2 bit data, n-3 bit data, and n-4 bit data) to create four weighted taps 86, 162, 164, and 166 to perform a more precise distortion correction to the distorted bit 81. In a similar manner to the distortion correction circuit 80, the distorted bit 81 may be transmitted to the amplifying device 82 via the channel 84. The DQ reference signal 83 may also be transmitted to the amplifying device 82.

From the amplifying device 82, the distorted bit 81 and the DQ reference signal 83 may be transmitted to the DFE 70. Bit data for the previous bits may be transmitted through the paths 72, 74, 76, and 78. The DFE 70 may be operated to correct the distortion from the distorted bit 81 using the four weighted taps 86, 162, 164, and 166 created from the bit data for the four previous bits. The DFE 70 may be operated to generate magnitudes and polarities for each of the weighted taps 86, 162, 164, and 166 for each of the previous bits transmitted along paths 72, 74, 76, and 78 which may be designed to offset the total distortion to the distorted bit 81 caused by the previously received bits.

One or more of a modified version of the distorted bit 81 and a modified version of the DQ reference signal 83 may be transmitted to the data latch 94. The corrected bit 88 may be transmitted to the deserializer 66 on the rising edge of the DQS signal 96 from the data latch 94. The deserializer 66 may be updated with the values for the n-1 bit, n-2 bit, n-3 bit, and the n-4 bit and the values may be stored for transmission along the paths 72, 74, 76, and 78. The distortion correction circuitry associated with the DFE 70 may be described in greater detail below.

Figure 8:
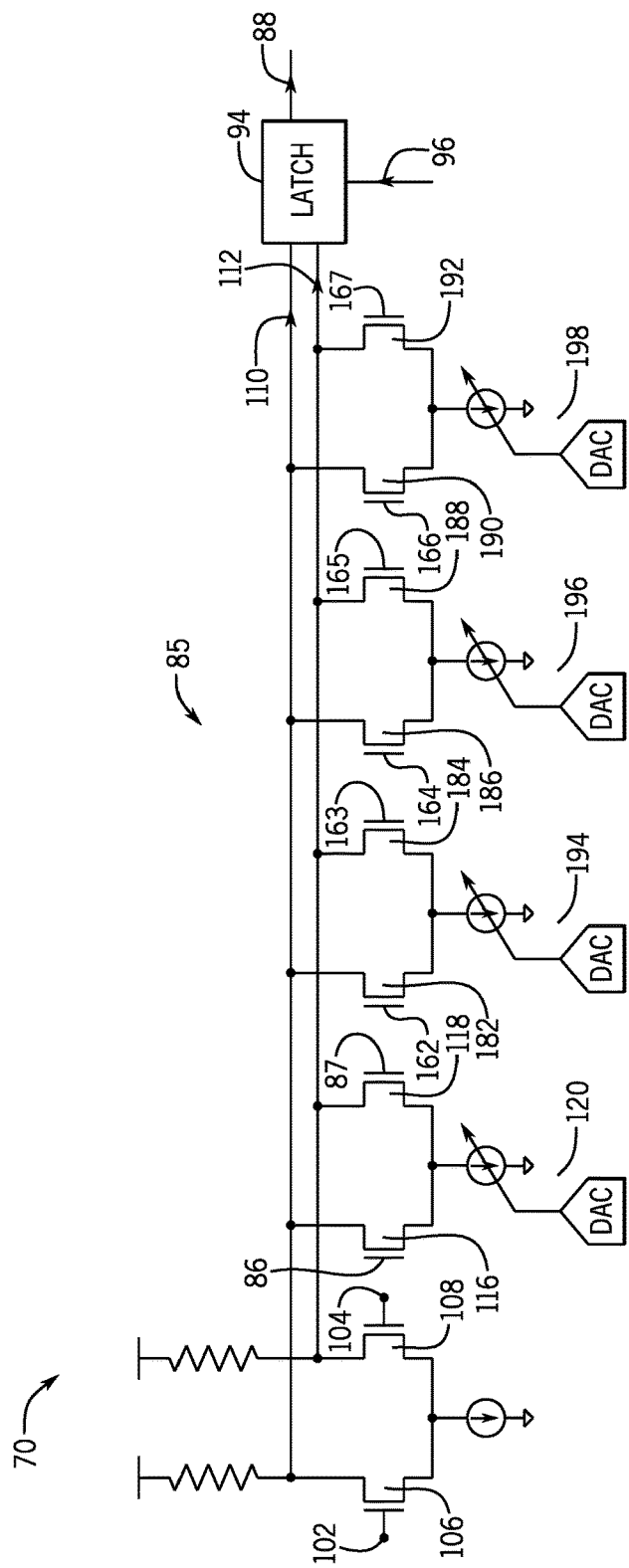
FIG. 8 illustrates a circuit diagram of a portion of the DFE of FIG. 7, according to an embodiment of the present disclosure.

FIG. 8 illustrates a circuit diagram of a portion of the DFE 70 of FIG. 7 that may negate distortions. As additionally illustrated in FIG. 8, the DFE 70 may receive a logical high or low for the n-1 bit, the n-2 bit, the n-3 bit, or the n-4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, and 167 as control signals for the field effect transistors 116, 118, 182, 184, 186, 188, 190, and 192 to control outputs therefrom transmitted to the outputs 110 and 112. The field effect transistors 116, 118, 182, 184, 186, 188, 190, and 192 may be selectively and controllably activated to reflect one of the sixteen (e.g., $2^4$) different possible binary states represented by the various combinations of previously corrected bits (e.g., 0000, 0001, 0010, . . . 1111).

The weighted tap 86, 87, 162, 163, 164, 166 and 167 values may be applied to the outputs 110 and 112, whereby the current supplied is controlled through the controllable source 120 and additional controllable sources 194, 196, and 198 (e.g., a current source controlled by a digital to analog converter). The outputs 110 and 112 may be transmitted to the data latch 94. The corrected bit 88 may be generated via the data latch 94 based upon the outputs 110 and 112 and may be transmitted to the deserializer 66 on the rising edge of the DQS signal 96. The n-1 bit, the n-2 bit, the n-3 bit, and the n-4 bit information stored for transmission along the paths 72, 74, 76, and 78 in the deserializer 66 may be updated with the corrected bit 88 (e.g., n-4 bit will update to reflect n-3 data, n-3 bit will update to reflect n-2 data, n-2 data will update to reflect n-1 data, and n-1 data will update with the newly corrected bit) for future distortion corrections.

Figure 9:
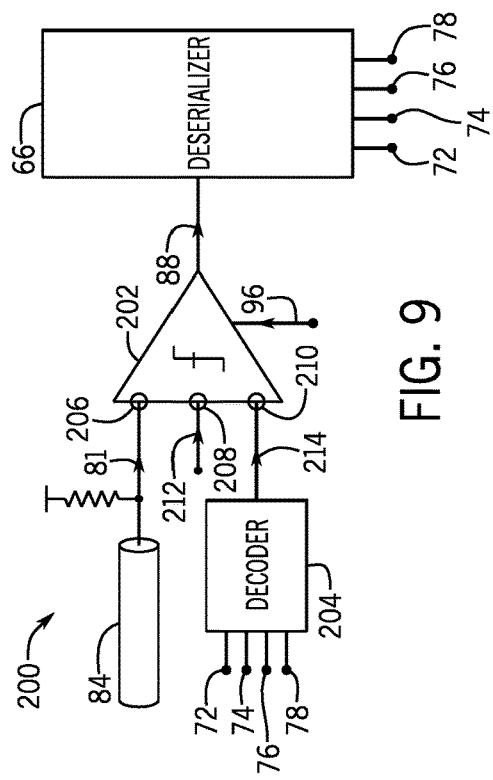
FIG. 9 illustrates a third embodiment of a distortion correction circuit, according to an embodiment of the present disclosure.

In some embodiments, a method of distortion correction that may avoid the amplifying device 82 may be desired. FIG. 9 shows a block diagram of a distortion correction circuit 200 that may avoid using the amplifying device 82. The distortion correction circuit 200 includes an equalizer 202 (e.g., regenerative latch circuitry and DFE circuitry combined into one device) and a decoder 204 (e.g., four to sixteen bit decoder). The distorted bit 81 may be received via the channel 84. The distorted bit 81 may be received by the equalizer 202 at a terminal 206. The circuitry of the DFE 70 may be included within the equalizer 202. A decoded signal 214 (e.g., a control signal) and a voltage correction signal 212 (e.g., a weighted or otherwise adjusted version of the DQ reference signal 83) may also be received by the equalizer 202.

The decoded signal 214 may be transmitted to the equalizer 202 at a terminal 210. A four bit sequence represented by the data on paths 72, 74, 76, and 78 (e.g., 0000, 0001, . . . 1111) may be converted by the decoder 204 into one of sixteen possible states which may be outputted to as the decoded signal 214 (e.g., 0000000000000001, 0000000000000010, . . . 1000000000000000). The sixteen possible states may correspond to all possible combinations of the four corrective previous bits of data (e.g., $2^4$). In additional embodiments, more or less than four corrective previous bits of data may be used to create the decoded signal 214. In other embodiments, in place of being directly coupled, the paths 72, 74, 76, and 78 may be represented with weighted tap values 86, 162, 164, and 166 as inputs into the decoder 204. One or more voltage correction signals 212 corresponding to the different states indicated by the decoded signal 214 may be transmitted to a terminal 208.

The value of the distorted bit 81 may be corrected by the equalizer 202. The correction may be performed such that an output 216 from the equalizer 202 is the corrected bit 88. The corrected bit 88 may be sent to the deserializer 66 on the rising edge of the DQS signal 96. In the deserializer 66, the n-1 bit, the n-2 bit, the n-3 bit, and the n-4 bit stored may be updated in accordance with the new data (e.g., n-4 bit will update to reflect n-3 data, n-3 bit will update to reflect n-2 data, n-2 data will update to reflect n-1 data, and n-1 data will update with the newly corrected bit) for use in future distortion corrections.

The method exemplified by the distortion correction circuit 200 may result in an increased speed of distortion correction. Rather than perform a summing function every time the resulting distortion correction factor, or distortion correction value, needs to be determined (e.g., via the distortion correction circuit 80), the distortion correction circuit 200 may have stored distortion correction values. The distortion correction value may have been stored such that when a specific distortion correction value for a specific state is needed, the value may be already ready to be used in the distortion correction. The means of implementation of the stored values may be elaborated on in FIG. 10.

Figure 10:
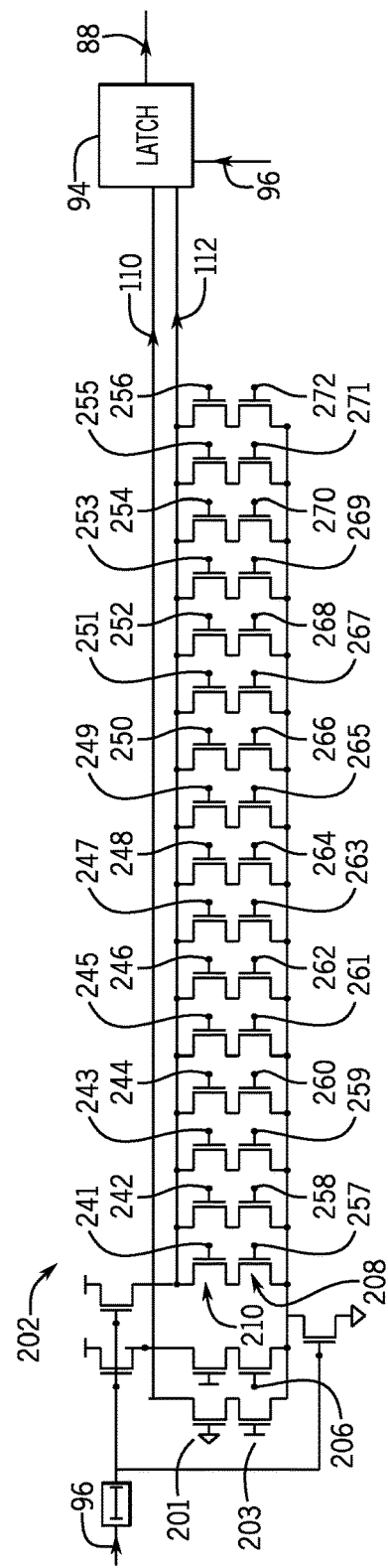
FIG. 10 illustrates a circuit diagram of the equalizer of FIG. 9, according to an embodiment of the present disclosure.

FIG. 10 illustrates a circuit diagram of a portion of the equalizer 202 of FIG. 9. The distorted bit 81 may be received at terminal 206 and sent to the output 110. The decoded signal 214 may be transmitted to the terminal 210. The connection between the decoder 204 and the terminal 210 may be made such that when the decoded signal 214 is transmitted to the terminal 210, the correct field effect transistor may be enabled. The correct field effect transistor may be enabled if it corresponds to the specific state specified by the decoded signal 214. A field effect transistor 241-256 specific to each possible state indicated by the decoded signal 214 (e.g., sixteen field effect transistors correspond to sixteen possible states) may be included in the terminal 210. For example, the decoded signal 214, 0000000000000001, may correspond to the first state of the decoded signal 214 and to the associated first field effect transistor 241, which may be the correct field effect transistor enabled upon reception of the decoded signal 214. Additionally, for example, 0000000000000010 may correspond to the second state of the decoded signal 214 and may not enable the first field effect transistor but rather may only enable a second field effect transistor 242. When enabled, the associated corrective voltages coupled through the field effect transistors 257-272 may be transmitted to affect the output 112 by the correct field effect transistor 241-256 for the specific state. For example, 0000000000000010 may correspond to the second state of the decoded signal 214 and may enable a second field effect transistor 242 allowing the associated corrective voltage coupled to the field effect transistor 248 to affect the output 112.

Figure 11:
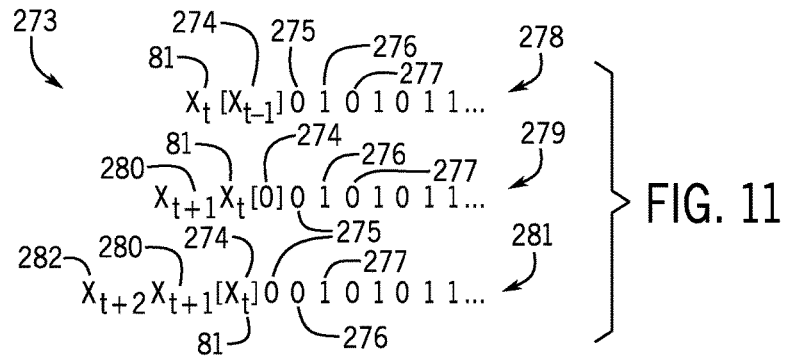
FIG. 11 illustrates a diagram of a bitstream that may be communicated, according to an embodiment of the present disclosure.

The outputs 110 and 112 may be transmitted to the data latch 94. The corrected bit 88 may be generated via the data latch 94 based upon the outputs 110 and 112 and may be transmitted to the deserializer 66 on the rising edge of DQS signal 96. In the deserializer 66, the n-1 bit, the n-2 bit, the n-3 bit, and the n-4 bit stored may be updated in accordance with the new data for use in future distortion corrections. In some embodiments, it may be desirable to test the circuit performance through the simulation of load requirements (e.g., via "dummy" load, e-load, electronic load, current sink). Simulation of load requirements may be performed using the connections provided at field effect transistors 201 and 203. In some embodiments it may be desirable to increase the rate at which the data is transmitted. FIG. 11 illustrates one technique for handling data transmitted at high rates while still allowing for correct processing by the DQ receiver 62.

FIG. 11 illustrates a data stream 273 transmitted to the DQ receiver 62 at three different times and includes the distorted bit 81 received, the n-1 bit 274, the n-2 bit 275, the n-3 bit 276, and the n-4 bit 277. A first bitstream 278 may be the data stream 273 transmitted at t=0. Enough time may not have passed between the transmission of the n-1 bit 274 and the reception of the distorted bit 81 to allow for calculation of the distortion contribution of the n-1 bit 274. If this occurs, one solution may be to wait for the n-1 bit 274 information to complete transmitting to the deserializer 66 so it may be used in the distortion calculation.

A second bitstream 279 may be the data stream 273 transmitted at t=1. The second bitstream 279 may illustrate the distorted bit 81 received and a second distorted bit 280 received. Enough time may have passed to allow for the n-1 bit 274 to be known to the deserializer 66 but it has not yet been applied to aid in the correction determination of the value of the distorted bit 81. A third bitstream 281 may be the data stream 273 transmitted at t=2. The third bitstream 281 may show the second distorted bit 280 to be received at the DQ receiver 62 and a third distorted bit 282 to be received at the DQ receiver 62. However not enough time has passed for the distorted bit 81 to become the corrected bit 88 and to be received in the deserializer 66 as the new n-1 bit 274 information to correct the distortion of the second distorted bit 280. Thus, as with the second bitstream 279 at t=1, the distortion calculation must wait until the n-1 bit 274 may be received in the deserializer 66 and be transmitted for distortion correction. There may exist a more time efficient solution than waiting for the n-1 bit 274 to transmit without performing any additional processes during the waiting time.

Figure 12:
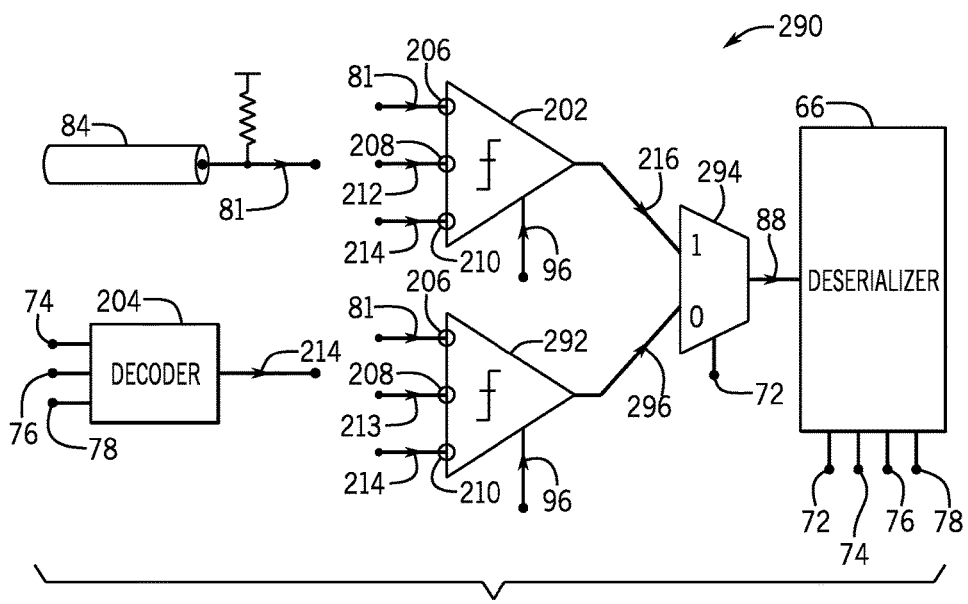
FIG. 12 illustrates a fourth embodiment of a distortion correction circuit, according to an embodiment of the present disclosure.

One solution may be calculating the distortion contribution of the n-2 bit, the n-3 bit, and the n-4 bit using both possibilities of values of the n-1 bit (e.g., logical high and logical low) and to discard the incorrect distortion when the n-1 bit is known. FIG. 12 illustrates a distortion correction circuit 290 which may implement this solution.

FIG. 12 illustrates a block diagram of the distortion correction circuit 290 which may implement an efficient solution for handling data transmitted faster than otherwise may be processed. The distortion correction circuit 290 includes the components of the distortion correction circuit 200 in addition to an equalizer 292 and a selection device 294 (e.g., a multiplexer). The distorted bit 81 may be transmitted to the terminal 206 of the equalizer 202 as well as to the terminal 206 of the equalizer 292. The decoder 204 may be a three to eight decoder and may output the decoded signal 214.

In this embodiment, the decoded signal 214 may be an eight (e.g., $2^3$) bit state representation based on the combination of three bits from the paths 74, 76, and 78 received (e.g., for the example of three bits, 000 may correspond to 00000001 and/or 111 may correspond to 10000000) or their respective associated weight values. The path 72 may not be used in the decoder 204 because the true value of the n-1 bit has not yet been transmitted to the deserializer 66 for transmission along the path 72. The value of the n-1 bit transmitted along the path 72 may be assumed to be high for use in the equalizer 202 and low for use in the equalizer 292. The decoded signal 214 may be transmitted to the terminal 210 of the equalizers 202 and 292. One or more voltage correction signals 212 and 213 corresponding to the different states created by the decoder 204 may be transmitted to the terminal 208.

The voltage correction signals 212, transmitted to the equalizer 202, may be different than the voltage correction signals 213, transmitted to the equalizer 292. The equalizer 202 may receive the voltage correction signals corresponding to binary codes 1000 through 1111 since the equalizer 202 represents the n-1 bit being a logical high. The equalizer 292 may receive the voltage correction signals corresponding to binary codes 0000 through 0111 since the equalizer 292 represents the n-1 bit being a logical low.

The equalizers 202 and 292 may correct the distortion associated with the distorted bit 81, using the three inputs at the terminals 206, 208, and 210. This may be done in such a way that the output 216 from the equalizer 202 represents the corrected bit 88 for if the n-1 bit is a logical high and the output 296 from the equalizer 292 represents the corrected bit 88 if the n-1 bit is a logical low.

Once outputs 296 and 216 are transmitted to the selection device 294, enough time may have passed for the n-1 bit to be transmitted to the deserializer 66 and to the selection device 294. The n-1 bit transmitted along the path 72 may be used to select the corrected bit 88 from the outputs 216 and 296. If the n-1 bit is logical high, the output 216 may be selected as being the corrected bit 88. However, if the n-1 bit is logical low, the output 296 may be selected as being the corrected bit 88. The output from the selection device 294 may be sent to the deserializer 66 as the corrected bit 88. In the deserializer 66, the n-1 bit, the n-2 bit, the n-3 bit, and the n-4 bit may be updated in accordance with the corrected bit 88 (e.g., n-4 bit will update to reflect n-3 data, n-3 bit will update to reflect n-2 data, n-2 data will update to reflect n-1 data, and n-1 data will update with the newly corrected bit). It may be noted that the corrected bit 88 may not complete transmission and updating of all values prior to the reception of the second distorted bit 278, thus the method of waiting, as described, may be repeated.

Figure 13:
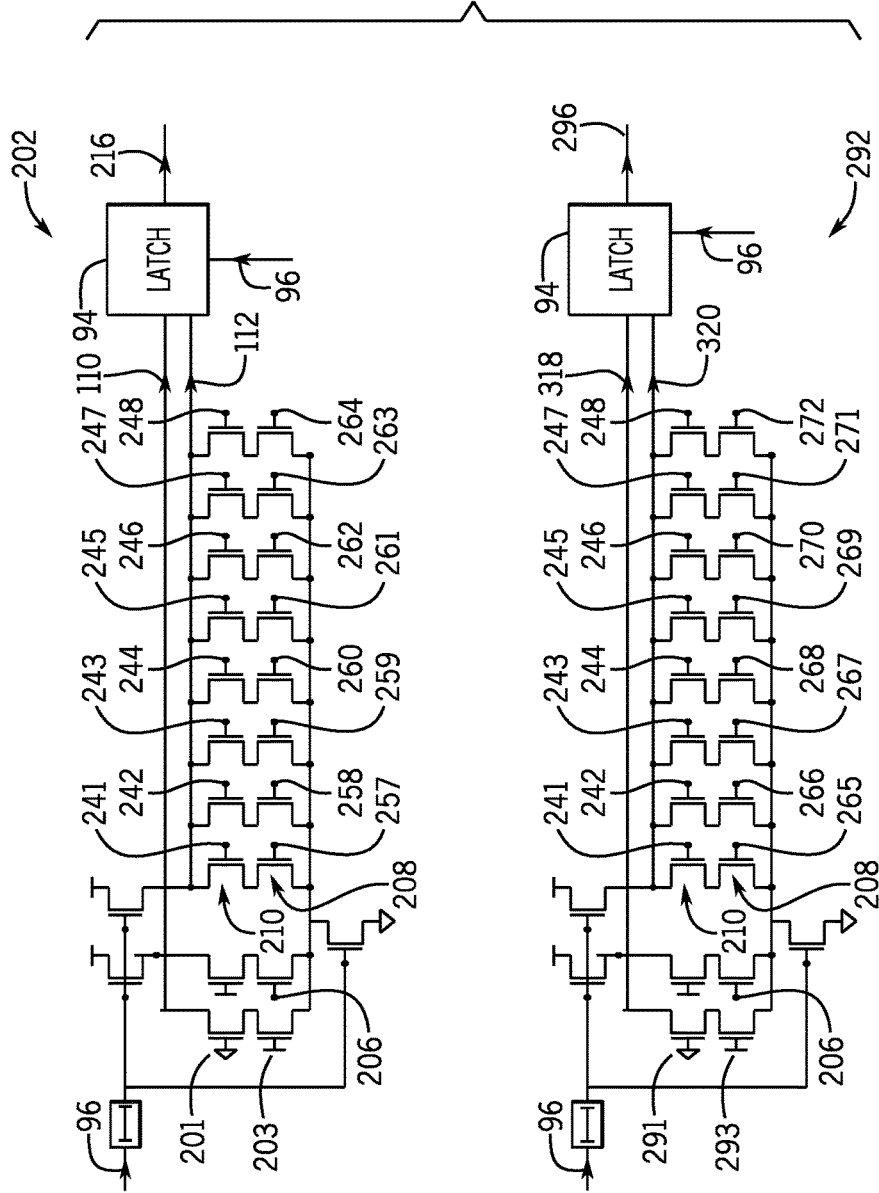
FIG. 13 illustrates a circuit diagram of the equalizer of FIG. 12, according to an embodiment of the present disclosure.

FIG. 13 illustrates a circuit diagram for a portion of the equalizers 202 and 292 of FIG. 12. The distorted bit 81 may be received at the terminal 206 and sent to the output 110 and an output 318.

The decoded signal 214 may be transmitted to the terminal 210. The connection between the decoder 204 and the terminal 210 is such that when the decoded signal 214 transmits to the terminal 210, the correct field effect transistor may be enabled. The correct field effect transistor may be enabled as corresponding to the specific state indicated by the decoded signal 214 (e.g., 00000010 may indicate the second state and result in enabling the second field effect transistor 242 of both the equalizers 202 and 292). Field effect transistors 241-248 specific to each possible state of the decoder 204 (e.g., eight field effect transistors correspond to eight possible states) may be included in the first row of the equalizers 202 and 292 When enabled, the associated corrective voltages coupled through the field effect transistors 257-272 may be transmitted to affect the outputs 110 and 112 by the correct field effect transistor 241-256 for the specific state.

The decoded signal 214 may be transmitted to the terminal 210. The decoded signal 214 may represent two sets of eight states (e.g., 10000000 may enable an eighth state transistor as well as a sixteenth state transistor). The same decoded signal 214 may be used in both of the equalizers 202 and 292 in conjunction with different corrective voltages and field effect transistors to create the two sets of eight states. Due to the nature of performing the parallel distortion correction for both the n-1 bit being logical high and logical low, the decoded signal 214 may be used to indicate the state when the n-1 bit is logical high through the field effect transistors 241-248 of the equalizer 202 and when the n-1 bit is logical low through the field effect transistors 241-248 of the equalizer 292.

When the most significant bit of the binary representation of the previous bits is forced into either a logical high or logical low value, the range of states may be fixed. For example, when the n-1 bit is low (e.g., forced to 0XXX), the maximum binary representation that may occur is 0111 and a maximum of eight (e.g., $2^3$) possible states of representation exist (e.g., 0000, 0001, 0010, 0011, 0100, 0101, 0110, 0111). By changing the logical low to a logical high, a separate and second set of states may be created (e.g., 1000, 1001, 1010, 1011, 1100, 1101, 1110, 1111) to account for a total of sixteen (e.g., $2^4$) possible states. There may be one binary digit separating the first eight states from the second eight states. The separation of states between when the n-1 bit is logical high and when the n-1 bit is logical low may be made between the equalizers 202 and 292, since one equalizer may be designated for correcting distortion caused by the most significant bit of the previous bits being a logical high and the other may be designated for a logical low. The final decision between the two signals may be made by the selection device 294 and may be dependent on what the value of the n-1 bit is at the time of selection.

For example, the eighth field effect transistor 248 may be enabled in both of the equalizers 202 and 292. The eighth state option for the decoded signal 214 (e.g., 10000000) may have transmitted to the equalizer 202, representing the eighth state if the n-1 bit was logical low and the other bits were logical high (e.g., 0111), and to the equalizer 292, representing the sixteenth state if the n-1 bit was logical high and the other bits were logical high (e.g., 1111). This results in one decoded signal 214 affecting the two outputs 216 and 296 through enabling the field effect transistor 248 in the two different equalizers 202 and 292.

Potentially different voltage correction values by be transmitted by the voltage correction signals 212 and 213 to the terminal 208 on the equalizers 202 and 292. When enabled by the decoded signal 214, the correct field effect transistor for the indicated state may be allowed to have the associated corrective voltages from the voltage correction signals 212 and 213 affect the output 112 and an output 320. The outputs 110, 112, 318, and 320 may be transmitted through the data latch 94 circuitry. The outputs 216 and 296 may be sent to the selection device 294 on the rising edge of the DQS signal 96 for the corrected bit 88 selection by the n-1 bit. In some embodiments, it may be desired to simulate load requirements, as described earlier, through the connections provided at field effect transistors 201, 203, 291, and/or 293.

In some embodiments, it may be desired to compensate for limited transmission bandwidth at the DQ receiver 62. The solution may lie in adding duplicates of the equalizers 202 and 292 and selection devices 294 that may allow for rapid computing of distortion correction values.

Figure 14:
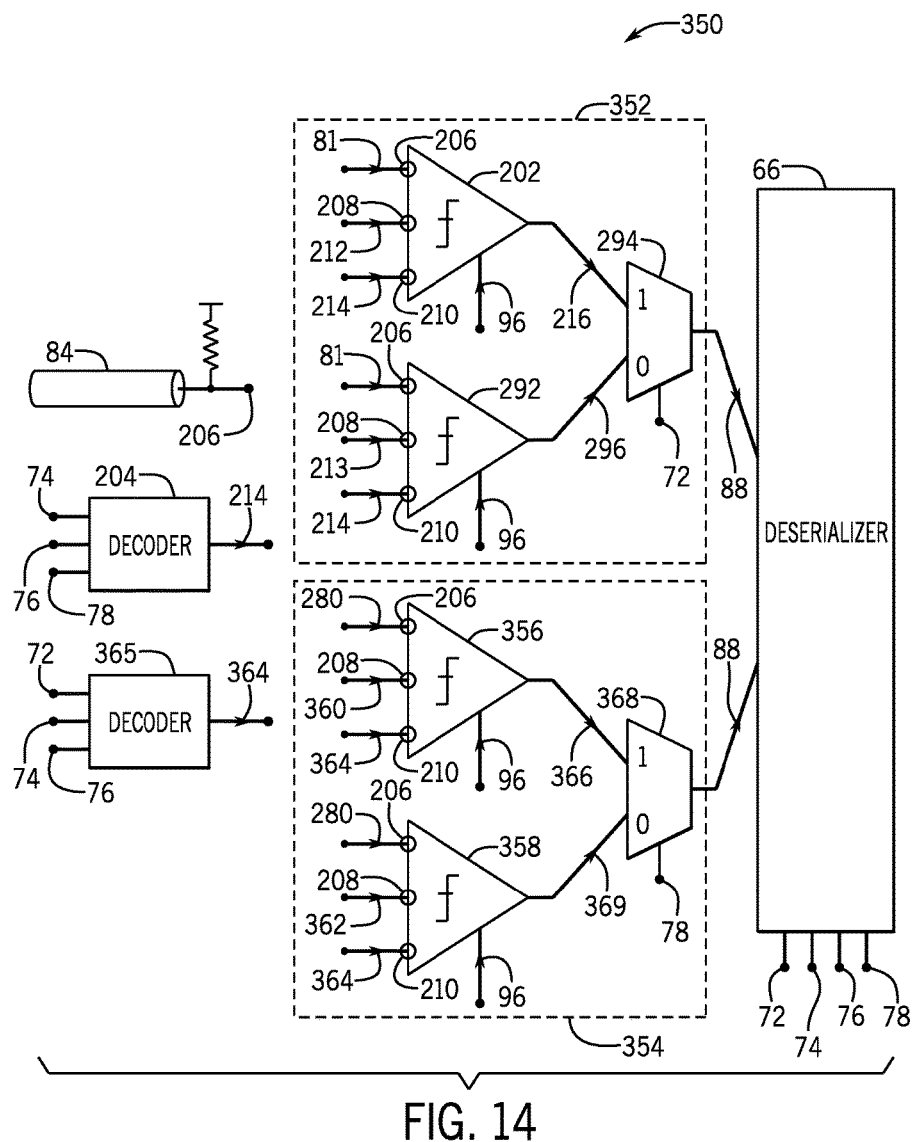
FIG. 14 illustrates a fifth embodiment of a distortion correction circuit, according to an embodiment of the present disclosure.

FIG. 14 illustrates a block diagram of a distortion correction circuit 350 which may compensate for transmission bandwidth and includes two duplications of the distortion correction circuit 290, a first circuit 352 and a second circuit 354, with modification to the inputs. The first circuit 352 may be operated in a similar manner as described above with respect to the distortion correction circuit 290. In the same manner as in the first circuit 352, the second circuit 354 may have received the second distorted bit 280 to the terminals 206, a voltage correction signals 360 and 362 to the terminals 208, and a decoded signal 364 to the terminals 210. As described above, to compensate for limited transmission bandwidth, a method of rolling the distorted bit 81 received between the first circuit 352 and the second circuit 354 may be followed as a method of alleviating a backup of distorted bits 81 resulting from limited transmission bandwidth. In this way, as the distorted bit 81 is being processed in the first circuit 352 in a first iteration of distortion correction, the second distorted bit may be received in the second circuit 354 to start a second iteration of distortion correction. This allows the second iteration of distortion correction to occur while the first iteration of distortion correction is completing. As such, the first iteration may be completed before the third distorted bit 282 is received at the channel 84, this occurs in a manner that allows the third distorted bit 282 to be rolled back to the first circuit 352 for a third iteration of distortion correction. FIG. 14 will be elaborated on to provide more information on the method of rolling the distorted bit 81 received.

The voltage correction signal 360 may be different from the voltage correction signal 362. The voltage correction signals 360 and 362 may be different than the voltage corrections signals 212 and 213. The voltage correction signals 360 and 362 may have assigned corrective voltage values to the sixteen different states as a method to individually weight the influence of each of the four previous bits on the total distortion of the distorted bit 81 without having to recalculate the corrective voltage values each time a distortion correction may occur. The sixteen possible states (e.g., $2^4$) may have resulted in different amounts of distortion to the second distorted bit 280. In this way, the sixteen distortion values may be represented by two voltage corrective signals, where voltage corrective signal 362 may represent the first through the eighth values and the voltage corrective signal 360 may represent the ninth through the sixteenth values. The representation may be derived from the equalizer 356 representing the bit distortion correction when the n-1 bit is logical high (e.g., 1XXX) and the equalizer 358 representing the bit distortion correction when the n-1 bit is logical low (e.g., 0XXX). When the most significant bit is forced into either a logical high or logical low value, this fixes the range of states. For example, when the n-1 bit is logical low, (e.g., forced to 0XXX), the maximum binary representation that may occur is 0111, meaning that a maximum of eight possible states of representation exist (e.g., 0000, 0001, 0010, 0011, 0100, 0101, 0110, 0111).

The decoded signal 364 may be created in a similar way as the decoded signal 214. The decoded signal 364 may result from the n-2 bit, the n-3 bit, and the n-4 bit inputs transmitted along the paths 72, 74, and 76 to a decoder 365, while the n-1 bit transmitted along the path 78 may be used to determine the final correct bit with a selection device 368. It may be important to note that the previous bits may be stored for transmission along the paths 72, 74, 76, and 78 in any order as long as during the distortion correction, the proper previous bit order is observed (e.g., n-1 bit as the most significant bit and the n-4 bit as the least significant bit). The decoded output 364 may still be an eight bit representation of one of eight possible states. An output 366 may be representative of the second distorted bit 280 corrected of the distortion caused by the n-2 bit, the n-3 bit, and the n-4 bit, but with the n-1 bit being a logical high. An output 369 may be representative of the second distorted bit 280 corrected of the distortion caused by the n-2 bit, the n-3 bit, and the n-4 bit, but with the n-1 bit being a logical low.

The equalizers 356 and 358 follow a similar process as was described above with respect to the equalizers 202 and 292. The outputs 366 and 369 may have resulted from the distortion correction process. The outputs 366 and 369 may be transmitted to the selection device 386, controlled by rising edge of the DQS signal 96. When received by the selection device 386, the outputs 366 and 369 may wait until the n-1 bit is successfully transmitted to the selection device 368 and stored for transmission along the path 78.

When enough time has passed for the n-1 bit to be transmitted to the selection device 368 through the path 78, the corrected bit 88 may be selected using the n-1 bit transmitted along the path 78. The corrected bit 88 may be transmitted to the deserializer 66 and stored for transmission to the selection device 294. Data stored in the deserializer 66 for transmission along the paths 74, 76, and 78 may be updated accordingly. The distortion correction circuit 350 may have processed two bits of data while performing the four bits precision of voltage correction. However, there may exist an application of the distortion correction 350 may have required four bit processing, as opposed to two bit processing, in addition to the four bits of precision of voltage correction, as discussed earlier. A distortion correction circuit 400 suited for this application may be shown in FIG. 15.

Figure 15:
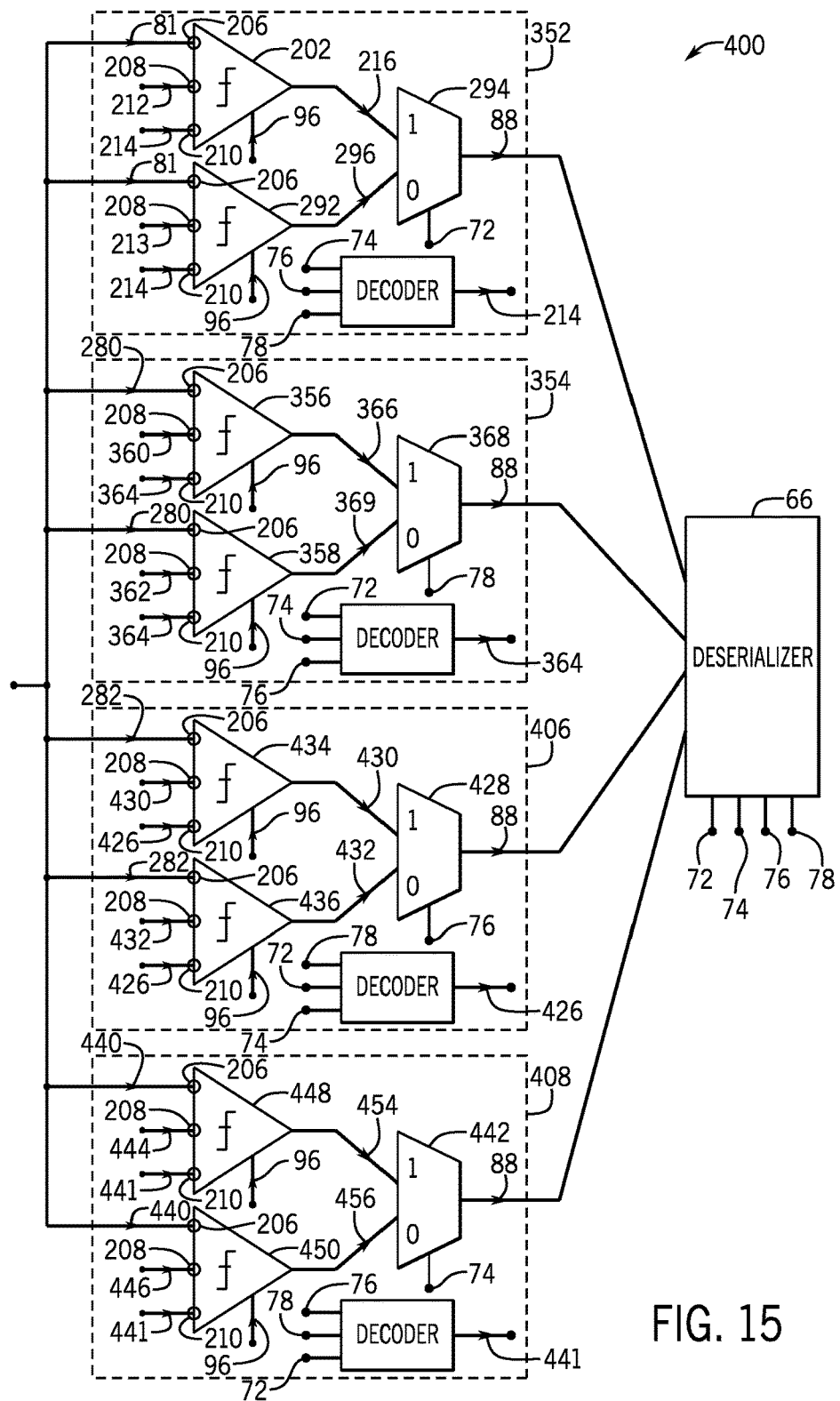
FIG. 15 illustrates a sixth embodiment of a distortion correction circuit, according to an embodiment of the present disclosure.

FIG. 15 illustrates the distortion correction circuit 400 which may be capable of processing four data bits at a four bit distortion correction level, and includes four duplications of the distortion correction circuit 290 with modification to the inputs between the duplications. The four duplications of the distortion correction circuit 290 may be illustrated with the first circuit 352, the second circuit 354, a third circuit 406, and a fourth circuit 408. In a similar manner as the distortion correction circuit 350, the method of rolling the distorted bit 81 received may be followed. As such, the distorted bit 81 may be received by the first circuit 352, the second distorted bit 280 may be received by the second circuit 354, the third distorted bit 282 may be received by the third circuit 406, a fourth distorted bit 440 may be received by the fourth circuit 408, and a fifth distorted bit may be rolled back to be received by the first circuit once the first iteration of the distortion correction is complete.

To elaborate further, the first circuit 352 may have received the distorted bit 81 and begun processing it using the method described with the distortion correction circuit 290, using the previous bit or weighted tap data transmitted along the paths 74, 76, and 78 to calculate the values necessary to supply the equalizers 202 and 292. The voltage correction signals 212 and 213 may have allowed the transmission of potentially different voltage correction values to the terminal 208 on the equalizers 202 and 292. Outputs 216 and 296 to the selection device 294 may be transmitted on the rising edge of the DQS signal 96. The selection device 294 may use the n-1 bit value stored in the deserializer 66 for transmission along path 72 to make the final decision on the corrected bit 88 value of the second distorted bit 280.

The inputs used for the final decision of the corrected bit 88 for the second circuit 404 may be different from the inputs for the first circuit 352. The second circuit 354 may have received the second distorted bit 280 and began processing it, after the distorted bit 81 is received. The method described with the distortion correction circuit 290 may be used to correct the distorted bit 280, except that the previous bit or weighted tap data transmitted along the paths 72, 74, and 76 may be used to calculate the values necessary to supply a decoded signal 364 to the equalizers 356 and 358. Potentially different voltage correction values to the terminal 208 may be transmitted by voltage correction signals 360 and 362 on equalizers 356 and 358. Outputs 366 and 369 to the selection device 368 may be transmitted on the rising edge of the DQS signal 96. The selection device 368 for the second circuit 354 may use the n-1 bit value stored in the deserializer 66 for transmission along path 78 to make the final decision on the corrected bit 88 value of the second distorted bit 278.

The inputs used for the final decision of the corrected bit 88 for the third circuit 406 may be different from the inputs for the second circuit 354. The third circuit 406 may have received the third distorted bit 282 and began processing it, after the second distorted bit 280 is received. The method described with the distortion correction circuit 290 may be used to correct the third distorted bit 282, except that the previous bit or weighted tap data transmitted along the paths 72, 74, and 78 may be used to calculate the values necessary to supply a decoded signal 426 to equalizers 434 and 436 at terminal 210. Potentially different voltage correction values to the terminal 208 may be transmitted by voltage correction signals 430 and 432 on equalizers 434 and 436. Outputs 430 and 432 to a selection device 428 may be transmitted on the rising edge of the DQS signal 96. The selection device 428 for the third circuit 406 may use the n-1 bit stored in the deserializer 66 for transmission along the path 76 to make the final decision on the corrected bit 88 value of the third distorted bit 282.

The inputs used for the final decision of the corrected bit 88 for the fourth circuit 408 may be different from the inputs for the third circuit 406. The fourth circuit 408 may have received a fourth distorted bit 440 and began processing it, after the third distorted bit 282 is received. The method described with the distortion correction circuit 290 may be used to correct the fourth distorted bit 440, except that the previous bit or weighted tap data transmitted along the paths 72, 76, and 78 may be used to calculate the values necessary to supply a decoded signal 441 to equalizers 448 and 450. Potentially different voltage correction values to the terminal 208 may be transmitted by voltage correction signals 444 and 446 on equalizers 448 and 450. Outputs 454 and 456 to the selection device 442 may be transmitted on the rising edge of the DQS signal 96. The selection device 442 for the fourth circuit 408 may use the n-1 bit stored in the deserializer 66 for transmission along the path 74 value to make the final decision on the corrected bit 88 value of the fourth distorted bit 412.

The output from the selection devices 294, 368, 428, and 442 may be sent to the deserializer 66 at the conclusion of each final decision on the corrected bit 88. In the deserializer 66, the n-1 bit, the n-2 bit, the n-3 bit, and the n-4 bit may be used to update the data stored in the deserializer 66 for transmission along the paths 72-78 in accordance with the corrected bit 88 data (e.g., the corrected bit 88 from the first circuit 402 will be stored for transmission along the path 78, the corrected bit data from the second circuit 404 will be stored for transmission along the path 76, the corrected bit data from the third circuit 406 will be stored for transmission along the path 74, and the corrected bit data from the fourth circuit 408 will be stored for transmission along the path 72). It may be noted that the corrected bit 88 may not have completed transmission to the deserializer 66, nor updated values stored for transmission along the paths 72-78 prior to the reception of the fifth distorted bit, thus the method of delaying the final selection of the corrected bit 88 may be continued.

The voltage correction values transmitted to the equalizers in FIGS. 9-15 may be the outputs from a combinational circuit, hereinafter referred to as a voltage reference generator. Some embodiments may generate the voltage correction values in advance of performing the distortion correction processes (e.g., during a start-up and/or an initialization operational mode of the memory device 10). Thereafter, as described above with respect to FIGS. 5-8, the voltage correction values may be generated each time a distortion correction occurs.

The voltage reference generator may operate to generate magnitudes and polarities for taps (e.g., voltages) due to each previous bit to collectively offset the distortion caused by those previously received bits. The tap may be a weighted tap that may be combined, through one or more of adding and/or subtracting circuitry, with an initial reference value to generate an offset that corresponds to or mitigates the distortion of the received data (e.g., mitigates the distortion of distorted bit n). The voltage reference generator may, thus, generate a voltage correction value specific to each possible combination of data (e.g., logical high or logical low) that are transmitted along the paths 72, 74, 76, and/or 78. As may be appreciated, the voltage reference generator may be capable of providing voltage correction values for more or less than four previous bits of data used in distortion correction, depending on the granularity of ISI bit distortion correction desired.

Figure 16:
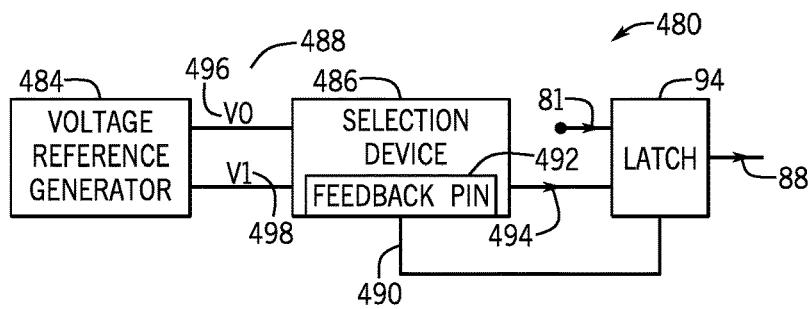
FIG. 16 illustrates a seventh embodiment of a distortion correction circuit, according to an embodiment of the present disclosure.

FIG. 16 illustrates a block diagram of a distortion correction circuit 480 including a voltage reference generator 484, a selection circuit (e.g., selection device 486), which may, in some embodiments, include a selecting element, a multiplexer, an equalizer, or a portion of an equalizer, and a latching element (e.g., the data latch 94). The voltage reference generator 484 may be operated to output the distortion correction factors, illustrated as reference voltages 488 via output pins, connectors, or other outputs or output devices. The reference voltages 388 may include a first reference voltage 496 and a second reference voltage 498 that may be transmitted to the selection device 486 and received via input pins, connectors, or other inputs or input devices. Calculated offsets for the distortion from the previously transmitted data bits affecting the distorted bit 81 may be represented by the reference voltages 488. In this way, voltage correction values transmitted to the terminal 208 of the previously described distortion correction circuits may be represented by the reference voltages 488.

The selection device 486 may be operated to determine which of the reference voltages 488 to transmit by output pins, connectors, or other outputs or output devices to the data latch 94. The determination may be based on feedback data (e.g., previous bit feedback data), as the binary representation of one or more previous bits of the data stream, which has already been transmitted through the distortion correction circuit 480. The distortion correction factors, or reference voltages 488, may be equal in number to the total number of possible binary states of the previous bit feedback data. Thus, each reference voltage 488 may correspond to a different and individual binary state of the previous bit feedback data. The previous bit feedback data may be transmitted as a control signal and may be operated to select which of the reference voltages 488 to transmit to the data latch 94. In the illustrated embodiment, the previous bit feedback data may be transmitted from the data latch 94 to a feedback pin 492 (which may represent one or more input pins, connectors, inputs, or other input devices) along the path 490. In some embodiments, the previous bit feedback data may be transmitted from the deserializer 66 or from a memory array 23 used for the storage of values, or indications of values, of the previous bit feedback data. The previous bit feedback data may, in some embodiments, be transmitted as an enable signal (e.g., a gate control signal or a binary control signal) through the feedback pin 492 to one or more of the field effect transistors 241-256 to select or coordinate the selection of the reference voltage 488.

In some embodiments, the path 490 may function similarly to the path 72, where the n-1 bit may be transmitted through the path 490 to the feedback pin 492. The previous bit feedback data may be transmitted to the feedback pin 492 of the selection device 486. The selection device 486 may be operated to utilize the previous bit feedback data to select the reference voltage 494 to be transmitted from an output pin, connector, output, or other output device to an input pin, connector, input, or other input device of the data latch 94. For example, the selection device 486 may select the first reference voltage 496 (e.g., V0) if the n-1 bit was logical low and may select the second reference voltage 498 (e.g., V1) if the previous bit feedback data indicated that the n-1 bit was logical high. In this way, the n-1 bit may be used to select the reference voltage 494 to be transmitted to an input the data latch 94.

The distorted bit 81 may be received at an input the data latch 94 and may be utilized in conjunction with the selected reference voltage 494 in a manner similar to that described above with respect to outputs 110 and 112. Additionally, the corrected bit 88 may be latched and/or saved to update the n-1 bit value as the previous bit feedback data to be transmitted along the path 490 for subsequent transmissions. In some embodiments, the corrected bit 88 may be transmitted to an input (e.g., input pin) of a deserializer 66.

Figure 17:
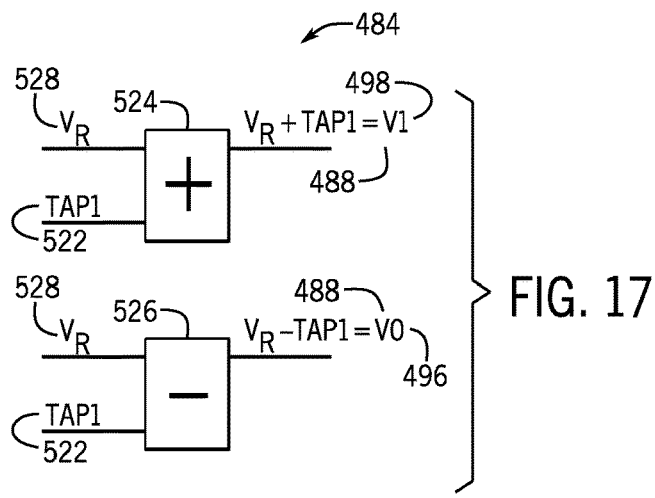
FIG. 17 illustrates a block diagram of the voltage reference generator of FIG. 16, according to an embodiment of the present disclosure.

FIG. 17 illustrates a block diagram of the voltage reference generator 484 of FIG. 16 including an adjustment signal, illustrated as input tap 522, an adding integrated circuit (IC) 524 (e.g., a digital adder inclusive of logic gates or circuitry including one or more of AND, OR, XOR, and/or NAND gates), and a subtracting IC 526 (e.g., a digital subtractor inclusive of logic gates or circuitry including one or more AND, OR, XOR, and/or NOT gates). The input tap 522 may represent the contribution to the distortion from the state (e.g., logical 0 or logical 1) of the n-1 bit. The reference signal, illustrated as voltage reference 528, may represent a value of voltage that may be altered to represent the true value of distortion in the distorted bit 81. In this manner, the addition or subtraction of the input tap 522 value to the voltage reference 528 value may result in two different representations; the first being a correction value representing the n-1 bit when it has a logic high value and a second being a correction value representing the n-1 bit when it has a logic low value. The input tap 522 may be added with the voltage reference 528 to create a second bit distortion correction value (e.g., a second voltage level), illustrated as the second reference voltage 498, representing logical high. The input tap 522 may be subtracted from the voltage reference 528 to create a first bit distortion correction value (e.g., a first voltage level), illustrated as the first reference voltage 496, representing logical low. The case of one adjustment signal may be generalized to apply to any number of adjustment signals, or any number of input taps. In some embodiments, the path 490 may represent one or more feedback lines. Accordingly, the one or more previous bit feedback data may be transmitted on the path 490 and may be used to select the reference voltages 488.

Figure 18:
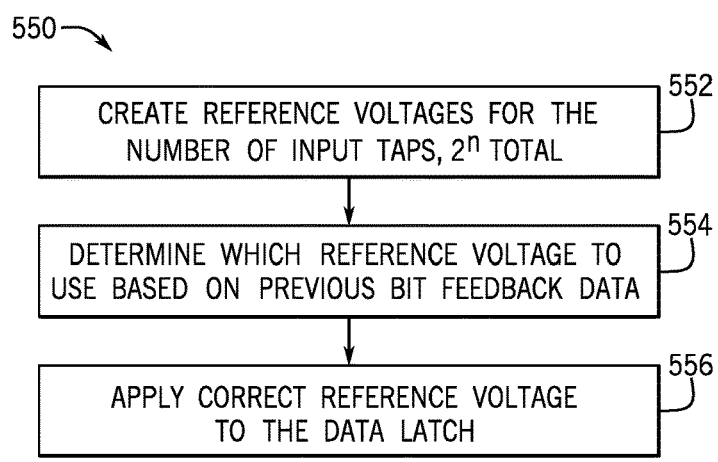
FIG. 18 illustrates a process to determine a reference voltage, according to an embodiment of the present disclosure.

FIG. 18 outlines a process 550 for applying the correct reference voltage to the data latch 94. As illustrated, the process 550 includes creating reference voltages for the number of input taps, $2^n$ total (process block 552), determining which reference voltage to use based on previous bit feedback data (process block 554), and applying the correct reference voltage to the data latch (process block 556).

For example, the voltage reference generator 484 may be operated to create the reference voltages 488 for the number of input taps (process block 552). The voltage reference generator 484 may be operated to create an appropriate number of reference voltages 488 for any number of input taps, or adjustment signals. The relationship $y=2^n$, where n is equal to the number of input taps and y is the number of reference voltages that may result from the voltage reference generator 484, may be observed by the number of reference voltages 488. The distortion contribution from the values of the previous bits to the distorted bit 81 may be represented by a tap for the previous bits, whereby the number of taps may be equal to the number of bits of distortion correction to apply to the distorted bit 81. In this way, the relationship $y=2^n$ may result from calculating a reference voltage for each possible combination (e.g., for three bits, 000, 001, 010, . . . 111) of the previous bit feedback data.

To create the reference voltages 488, for example, the voltage reference generator 484 may operate to add and/or subtract the adjustment signals, or input taps, with respect to the voltage reference 528. The input taps may be added or subtracted using adding ICs and subtracting ICs. The input taps may represent the specific contribution of the value of that previous bit (e.g., input tap may correspond to the n-1 bit, input tap may correspond to the n-2 bit) to the overall distortion of the distorted bit 81. There may be one adding IC 524 and one subtracting IC 526 per input tap adding IC 524 and subtracting IC 526, such that the total number of each type of ICs equals $2^n-1$, where n is equal to the number of input taps (e.g., one tap results in one adding IC 524 and one subtracting IC 526, two taps result in three adding ICs 524 and three subtracting ICs 526, three taps result in seven adding ICs 524 and seven subtracting ICs 526). In this manner, the combinations of the logical high and logical low values of each previous bit for each input tap may be generated (e.g., the voltage reference 528 transmitted through three adding ICs 524 generally corresponds to the state represented by the bits 111, the voltage reference 528 transmitted through three subtracting ICs 526 generally corresponds to the state represented by the bits 000, and the voltage reference 528 transmitted through an adding IC 524, then a subtracting IC 526, and then an adding IC 524 generally corresponds to the state represented by the bits 101).

In this example, the selection device 486 may be operated to determine which reference voltage 488 to send to an input (e.g., input pin) of the data latch 94 based off of the previous bit feedback data (process block 554). The previous bit feedback data may be represented as a number of n bits, which may correspond to the number of input taps used to create the reference voltages 488 (e.g., for two taps, n=2, two bits would be provided to the selection device 486 as the previous bit feedback data, and two tap corrective values may be used to calculate the $2^2$ possibilities of voltage references 488). Accordingly, the combinations of the previous bit feedback data values may be used to create a $2_n$ amount of different possible states. These different possible states (e.g., for the two tap example: 00, 01, 10, 11) may be used by the selection device 486, when transmitted as the previous bit feedback data to the feedback pin 492, to determine the selected reference voltage 494. The selected reference voltage 494 may be used in conjunction with distorted bit 81 to generate the corrected bit 88. The selected reference voltage 494 may be transmitted by the selection device 486 to an input (e.g., an input pin) of the data latch 94 (process block 556). In some embodiments, for example, the selected reference voltage 494 may be chosen before all previous bit feedback data is able to be received by the selection device 486. In this case, an assumption about the state of a tap may be made and the final decision on the selected reference voltage 494 may be delayed until the previous bit feedback data is received. The selected reference voltage 494 and the distorted bit 81 may be received by the data latch 94 via input pins or pins. The corrected bit 88 may be generated based on the distorted bit 81 and the selected reference voltage 494 and may additionally be transmitted by the data latch 94. The corrected bit 88 may be latched or saved to update the n-1 bit value in the previous bit feedback data.

Figure 19:
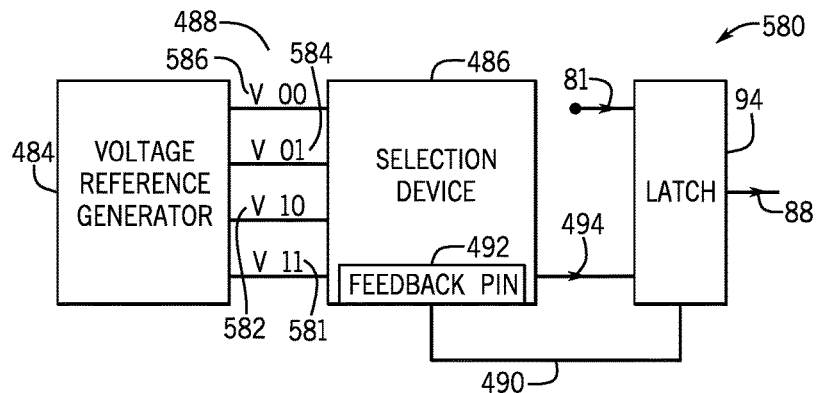
FIG. 19 illustrates an eighth embodiment of a distortion correction circuit, according to an embodiment of the present disclosure.

FIG. 19 illustrates a block diagram of a distortion correction circuit 580 including four resulting voltage reference values 488 from the voltage reference generator 484. The two bits (e.g., n-1 and n-2 bits) of previous bit feedback data correspond to two adjustment signals, or input tap values, used to create a first voltage reference 581, a second voltage reference 582, a third voltage reference 584, and a fourth voltage reference 586. As such, the selection device 486 may be operated to use the two bits of previous bit feedback data to determine the selected voltage reference 494 to be transmitted to the data latch 94 along the path 490 to the feedback pin 492. Additionally, as previously discussed, the corrected bit 88 may be generated by the latch 94 and may be transmitted to be latched or saved to update the n-1 bit value in the previous bit feedback data.

In some embodiments, the corrected bit 88, as illustrated in FIG. 19, may be replaced with output 216 and output 296 as being transmitted in place of illustrated corrected bit 88 when the distortion correction circuit 580 is utilized in place of the equalizers 202 and 292 of FIG. 12. Similarly, the illustrated corrected bit 88 of FIG. 19 may be replaced with outputs 216, 296, 366, and 396 as being transmitted in place of illustrated corrected bit 88 when the distortion correction circuit 580 is utilized in place of the equalizers 202, 292, 356, and 358 of FIG. 14. Likewise, the illustrated corrected bit 88 of FIG. 19 may be replaced with outputs 216, 296, 366, 396, 430, 432, 454, and 456 as being transmitted in place of illustrated corrected bit 88 when the distortion correction circuit 580 is utilized in place of the equalizers 202, 292, 356, 358, 434, 436, 448, and 450 of FIG. 15.

Figure 20:
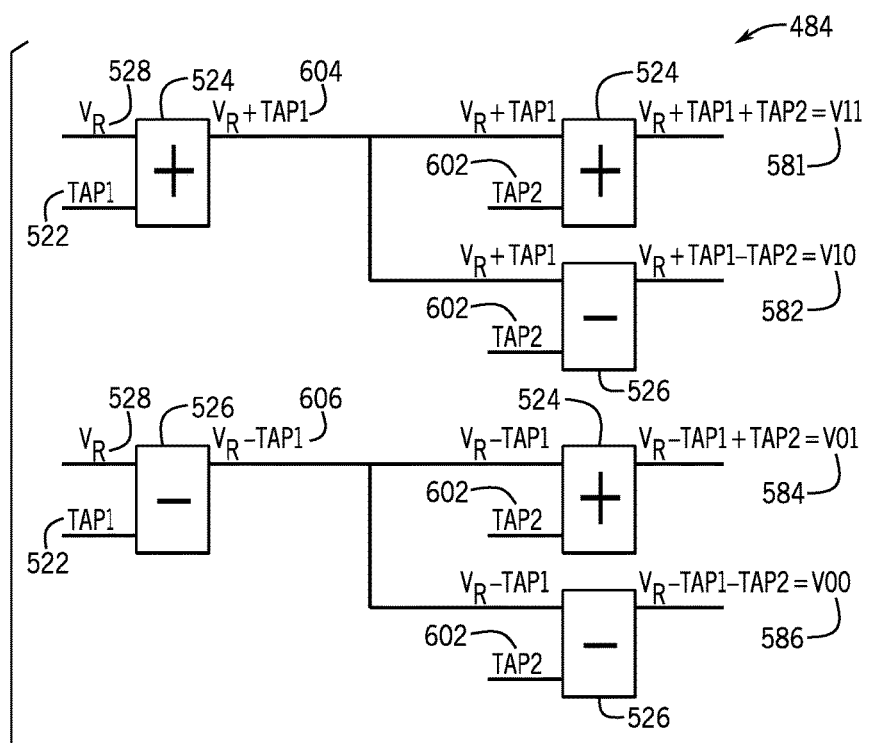
FIG. 20 illustrates a block diagram of the voltage reference generator of FIG. 19, according to an embodiment of the present disclosure.

FIG. 20 illustrates a block diagram of the voltage reference generator 484 of FIG. 19. As illustrated, the voltage reference generator 484 may include the input tap 522, an input tap 602, three adding ICs 524, and three subtracting ICs 526. To create the reference voltages 488, the voltage reference generator 484 may add and subtract the input tap 522 to the reference voltage 528, as a method to create a first output voltage 604 and a second output voltage 606. The first output voltage 604 may be added and subtracted to the input tap 602 to result in the first reference voltage 581 and the second reference voltage 582. The second output voltage 606 may be added to and subtracted from the input tap 602 to result in the third reference voltage 584 and the fourth reference voltage 586. As such, the process 550 may be applied to any number of taps.

Figure 21:
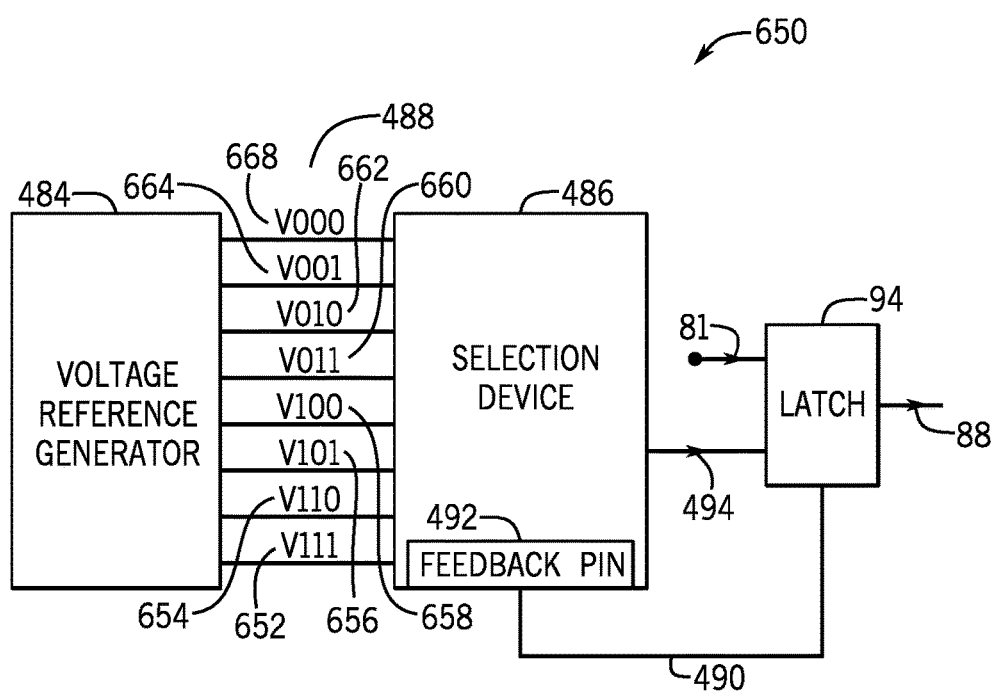
FIG. 21 illustrates a ninth embodiment of a distortion correction circuit, according to an embodiment of the present disclosure.

FIG. 21 illustrates a block diagram of a distortion correction circuit 650 including eight voltage references 488 created by the voltage reference generator 484. The three bits (e.g., n-1, n-2, and n-3 bits) of previous bit feedback data may correspond to three input tap values used to create the eight voltage references 488. As such, the selection device 486 may be operated to use the three bits of previous bit feedback data to determine the selected voltage reference 494 from the first through eighth reference voltage 652-668. Additionally, as such, the corrected bit 88 may be latched or saved to update the n-1 value in the previous bit feedback data.

In some embodiments, the illustrated corrected bit 88 of FIG. 21 may be replaced with output 216 and output 296 as being transmitted in place of illustrated corrected bit 88 when the distortion correction circuit 580 is utilized in place of the equalizers 202 and 292 of FIG. 12. Similarly, the illustrated corrected bit 88 of FIG. 21 may be replaced with outputs 216, 296, 366, and 396 as being transmitted in place of illustrated corrected bit 88 when the distortion correction circuit 580 is utilized in place of the equalizers 202, 292, 356, and 358 of FIG. 14. Likewise, the illustrated corrected bit 88 of FIG. 21 may be replaced with outputs 216, 296, 366, 396, 430, 432, 454, and 456 as being transmitted in place of illustrated corrected bit 88 when the distortion correction circuit 580 is utilized in place of the equalizers 202, 292, 356, 358, 434, 436, 448, and 450 of FIG. 15.

Figure 22:
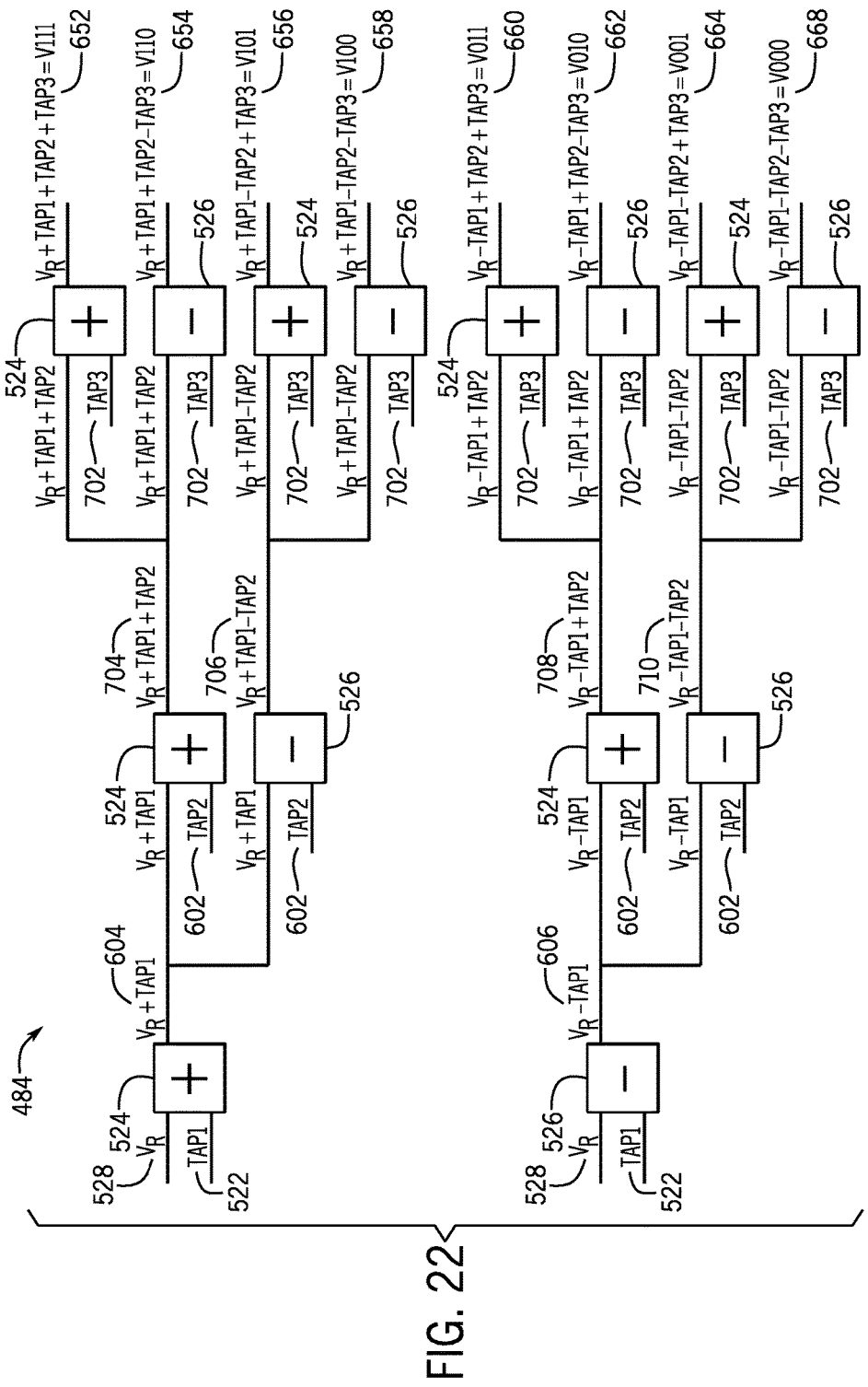
FIG. 22 illustrates a block diagram of the voltage reference generator of FIG. 21, according to an embodiment of the present disclosure.

FIG. 22 illustrates a block diagram of the voltage reference generator 484 of FIG. 21. As illustrated, the voltage reference generator 484 may include the input tap 522, the input tap 602, an input tap 702, seven of the adding ICs 524, and seven of the subtracting ICs 526. The voltage reference generator 484 may include three sets of adding ICs 524 and three sets of subtracting ICs 526. To create the reference voltages 488, the voltage reference generator 484 may operate to add and subtract the input tap 522 to the reference voltage 528, as a method to create the first output voltage 604 and the second output voltage 606. The first output voltage 604 may be added to and subtracted from the input tap 602 to result in a third output voltage 704 and a fourth output voltage 706. The second output voltage 606 may be added to and subtracted from the input tap 602 to result in a fifth output voltage 708 and a sixth output voltage 710. The third output voltage 704 may be added to and subtracted from the input tap 702 to result in the first reference voltage 652 and the second reference voltage 654. The fourth through sixth output voltages 706-710 may also be added to and subtracted from the input tap 702 to result in the third through eighth reference voltage 656-668. As may have been shown, the application of process 550 to different number of taps is allowed as long as there is the previous bit feedback data in addition to a sufficient number of adding ICs 524 and subtracting ICs 526 to support the creation of the voltage references 488.

Accordingly, the technical effects of the present disclosure include a method of creating reference voltages for the purpose of signal distortion correction. The method describes a process to calculate all combinations of possible distortions before an input signal is received. This allows the distortion correction values to be ready to modify a distorted input bit without requiring the resources to create the distortion correction value at each instance of the input of distorted bits.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a combinational circuit configured to create a one or more distortion correction factors used offset inter-symbol interference from a data stream on a distorted bit; and
   a selection circuit coupled to the combinational circuit, wherein the selection circuit comprises:
   a feedback pin configured to receive a control signal; and
   an output, wherein the selection circuit is configured to select a first distortion correction factor of the one or more distortion correction factors based upon the control signal and transmit the first distortion correction factor from the output.

2. The device of claim 1, comprising a latching element having a first input configured to be coupled to the output, wherein the first input is configured to receive the first distortion correction factor.

3. The device of claim 2, wherein the latching element is configured to generate the control signal as a binary representation of one or more previous bits of the data stream.

4. The device of claim 2, wherein the latching element comprises a second input configured to receive the distorted bit, wherein the latching element is configured to generate a modified value of the distorted bit based upon the distortion correction factor and the distorted bit.

5. The device of claim 4, comprising a deserializer coupled to the latching element and the selection circuit, wherein the deserializer is configured to receive the modified value of the distorted bit from the latching element and to store an indication of the modified value of the distorted bit.

6. The device of claim 5, wherein the deserializer is configured to store the indication of the modified value of the distorted bit as the binary representation of one or more previous bits of the data stream.

7. The device of claim 5, wherein the deserializer is configured to transmit the binary representation of the one or more previous bits of the data stream as the control signal.

8. The device of claim 1, the selection circuit comprises a switch configured to selectively transmit the first distortion correction factor when the switch is activated via the control signal.

9. The device of claim 1, wherein the selection circuit comprises a multiplexer.

10. The device of claim 1, wherein the distortion correction factors are equal in number to a total number of possible binary states of the control signal.

11. The device of claim 10, wherein total number of possible binary states of the control signal is dependent upon a number of stored values of previous bits of the data stream.

12. A device, comprising:
    a first combinational circuit, comprising:
    a first input configured to receive a reference signal;
    a second input configured to receive an adjustment signal; and
    an first output configured to transmit a first bit distortion correction value based upon the reference signal and the adjustment signal; and
    a second combinational circuit, comprising:
    a third input configured to receive the reference signal;
    a fourth input configured to receive the adjustment signal; and
    a second output configured to transmit a second bit distortion correction value based upon the reference signal and the adjustment signal, wherein the first bit distortion correction value comprises a first voltage level and the second bit distortion correction value comprises a second voltage level.

13. The device of claim 12, wherein the first combinational circuit comprises a digital adder configured to generate a sum of the reference signal and the adjustment signal as the first bit distortion correction value.

14. The device of claim 12, wherein the second combinational circuit comprises a digital subtractor configured to generate a difference between the reference signal and the adjustment signal as the second bit distortion correction value.

15. The device of claim 12, comprising:
    a third combinational circuit coupled to the first combinational circuit, wherein the third combinational circuit comprises:
    a fifth input configured to receive the first bit distortion correction value;
    a sixth input configured to receive a second adjustment signal; and
    a third output configured to transmit a third bit distortion correction value based upon the first bit distortion correction value and the second adjustment signal; and
    a fourth combinational circuit coupled to the first combinational circuit, wherein the fourth combinational circuit comprises:
    a seventh input configured to receive the first bit distortion correction value;

an eighth input configured to receive a second adjustment signal; and a fourth output configured to transmit a fourth bit distortion correction value based upon the first bit distortion correction value and the second adjustment signal.

16. The device of claim 12, comprising a selection circuit configured to receive the first bit distortion correction value and the second bit distortion correction value, wherein the selection circuit is configured to selectively transmit either the first bit distortion correction value or the second bit distortion correction value based upon received indications of values of bits transmitted to a memory array for storage.

17. A method, comprising:

generating a plurality of distortion correction factors, wherein each distortion correction factor of the plurality of distortion correction factors comprises a respective voltage value determined based upon a particular bit sequence of a set number of previously received bits of a bit stream;

selecting, via selection element, a distortion correction factor of the plurality of distortion correction factors;

transmitting the distortion correction factor to a latching element;

transmitting a distorted bit to the latching element; and generating, via the latching element, a modified value of the distorted bit based upon the distortion correction factor and the distorted bit.

18. The method of claim 17, wherein the selecting of the distortion correction factor is based upon a control signal having a number of states equivalent to a total number of binary states of the set number of previously received bits.

19. The method of claim 18, comprising transmitting the control signal from the latching element based upon stored indications of values of the set number of previously received bits.

20. The method of claim 17, generating the modified value of the distorted bit as a corrected bit value having compensated for inter-symbol interference due to the set number of previously received bits.

* * * * *